US010839913B2

(12) United States Patent
Maejima et al.

(10) Patent No.: US 10,839,913 B2
(45) Date of Patent: Nov. 17, 2020

(54) SEMICONDUCTOR MEMORY

(71) Applicant: Toshiba Memory Corporation, Minato-ku (JP)

(72) Inventors: Hiroshi Maejima, Tokyo (JP); Katsuaki Isobe, Yokohama (JP); Naohito Morozumi, Kawasaki (JP); Go Shikata, Moriya (JP); Susumu Fujimura, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/567,629

(22) Filed: Sep. 11, 2019

(65) Prior Publication Data

US 2020/0176061 A1 Jun. 4, 2020

(30) Foreign Application Priority Data

Nov. 29, 2018 (JP) ................................ 2018-224042

(51) Int. Cl.

| | |
|---|---|
| ***G11C 11/34*** | (2006.01) |
| ***G11C 16/04*** | (2006.01) |
| ***G11C 16/14*** | (2006.01) |
| ***G11C 16/26*** | (2006.01) |
| ***G11C 16/10*** | (2006.01) |
| ***G11C 16/24*** | (2006.01) |
| *H01L 27/11565* | (2017.01) |
| *H01L 27/11556* | (2017.01) |
| *H01L 27/11582* | (2017.01) |
| *H01L 27/11519* | (2017.01) |

(52) U.S. Cl.
CPC .......... *G11C 16/14* (2013.01); *G11C 16/0483* (2013.01); *G11C 16/10* (2013.01); *G11C 16/24* (2013.01); *G11C 16/26* (2013.01); *H01L 27/11519* (2013.01); *H01L 27/11556* (2013.01); *H01L 27/11565* (2013.01); *H01L 27/11582* (2013.01)

(58) Field of Classification Search
CPC ..... G11C 16/14; G11C 16/0483; G11C 16/24; G11C 16/26; G11C 16/30
See application file for complete search history.

(56) References Cited

U.S. PATENT DOCUMENTS

| | | | |
|---|---|---|---|
| 10,074,434 | B2 | 9/2018 | Shirakawa et al. |
| 2009/0267128 | A1 | 10/2009 | Maejima |
| 2009/0268522 | A1 | 10/2009 | Maejima |
| 2010/0207195 | A1 | 8/2010 | Fukuzumi et al. |
| 2010/0214838 | A1 | 8/2010 | Hishida et al. |
| 2011/0284946 | A1 | 11/2011 | Kiyotoshi |

(Continued)

FOREIGN PATENT DOCUMENTS

| | | |
|---|---|---|
| JP | 2015-176624 A | 10/2015 |

*Primary Examiner* — Toan K Le
(74) *Attorney, Agent, or Firm* — Oblon, McClelland, Maier & Neustadt, L.L.P.

(57) ABSTRACT

According to one embodiment, a semiconductor memory includes: a first bit line; a first select transistor having a first terminal connected to the first bit line; a first memory cell connected to a second terminal of the first select transistor; a circuit connected to the first bit line and applying an erase voltage to be applied to the first memory cell to the bit line via the first terminal and the second terminal; and a diode connected to the first bit line and the first circuit.

16 Claims, 20 Drawing Sheets

(56) References Cited

U.S. PATENT DOCUMENTS

| | | | | |
|---|---|---|---|---|
| 2012/0069660 | A1* | 3/2012 | Iwai | G11C 16/14 365/185.11 |
| 2012/0069663 | A1 | 3/2012 | Itagaki et al. | |
| 2012/0307557 | A1 | 12/2012 | Itagaki | |
| 2016/0267981 | A1* | 9/2016 | Hioka | G11C 7/067 |
| 2019/0279720 | A1* | 9/2019 | Nam | H01L 27/11582 |
| 2019/0385681 | A1* | 12/2019 | Yun | G11C 16/0483 |
| 2020/0143888 | A1* | 5/2020 | Rabkin | G11C 16/14 |

* cited by examiner

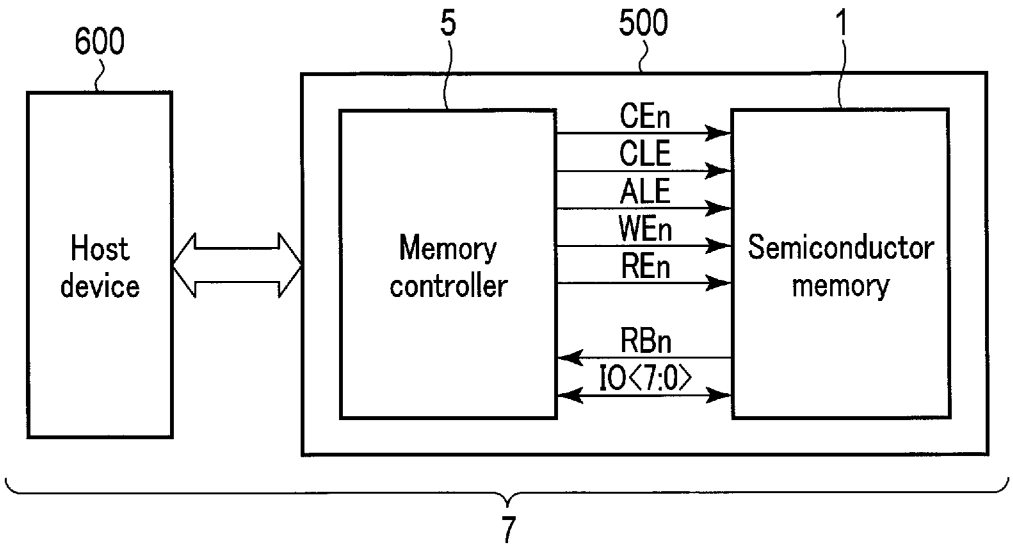
F I G. 1

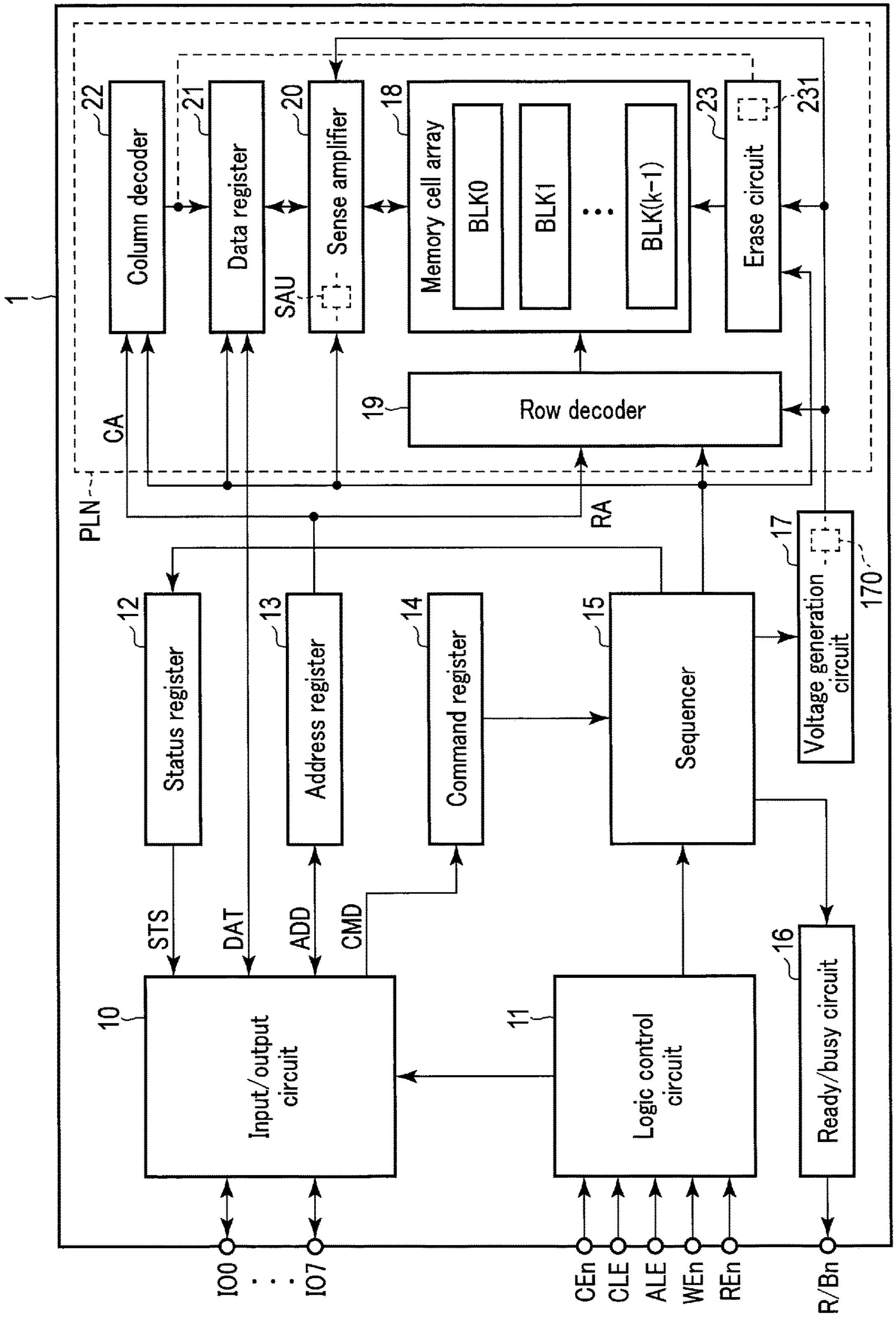
F I G. 2

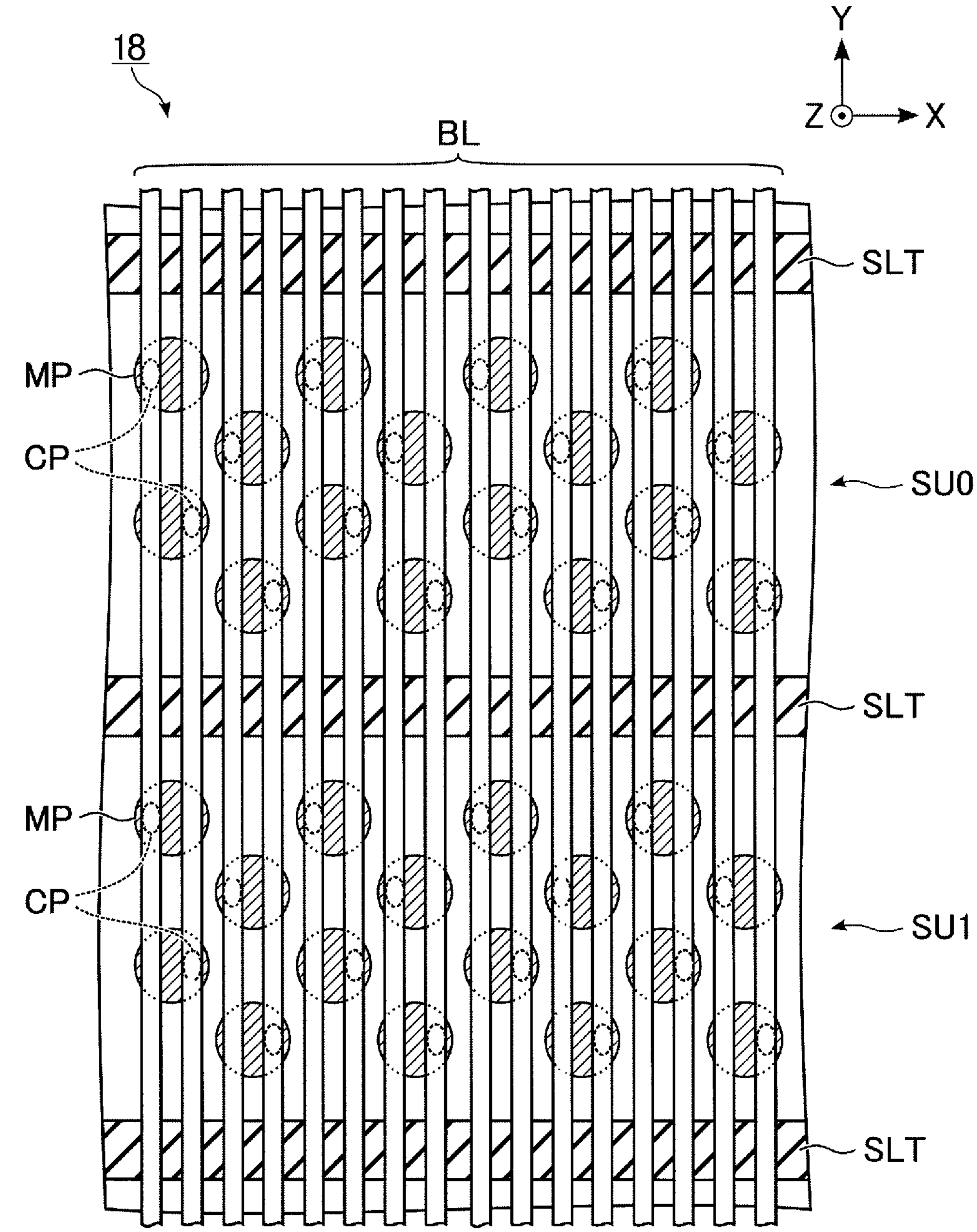
F I G. 4

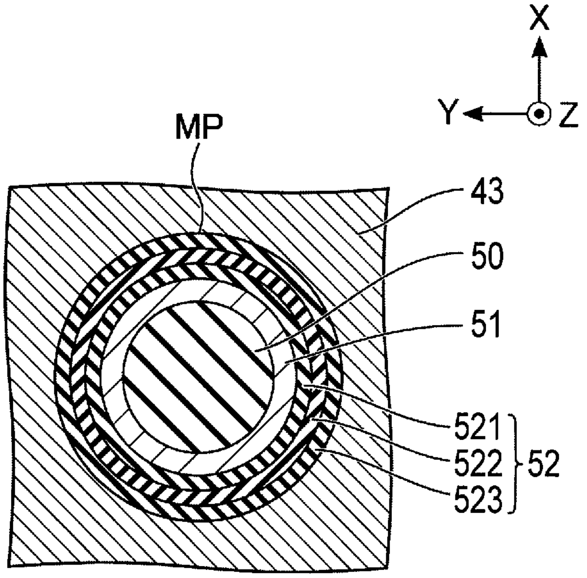
F I G. 6

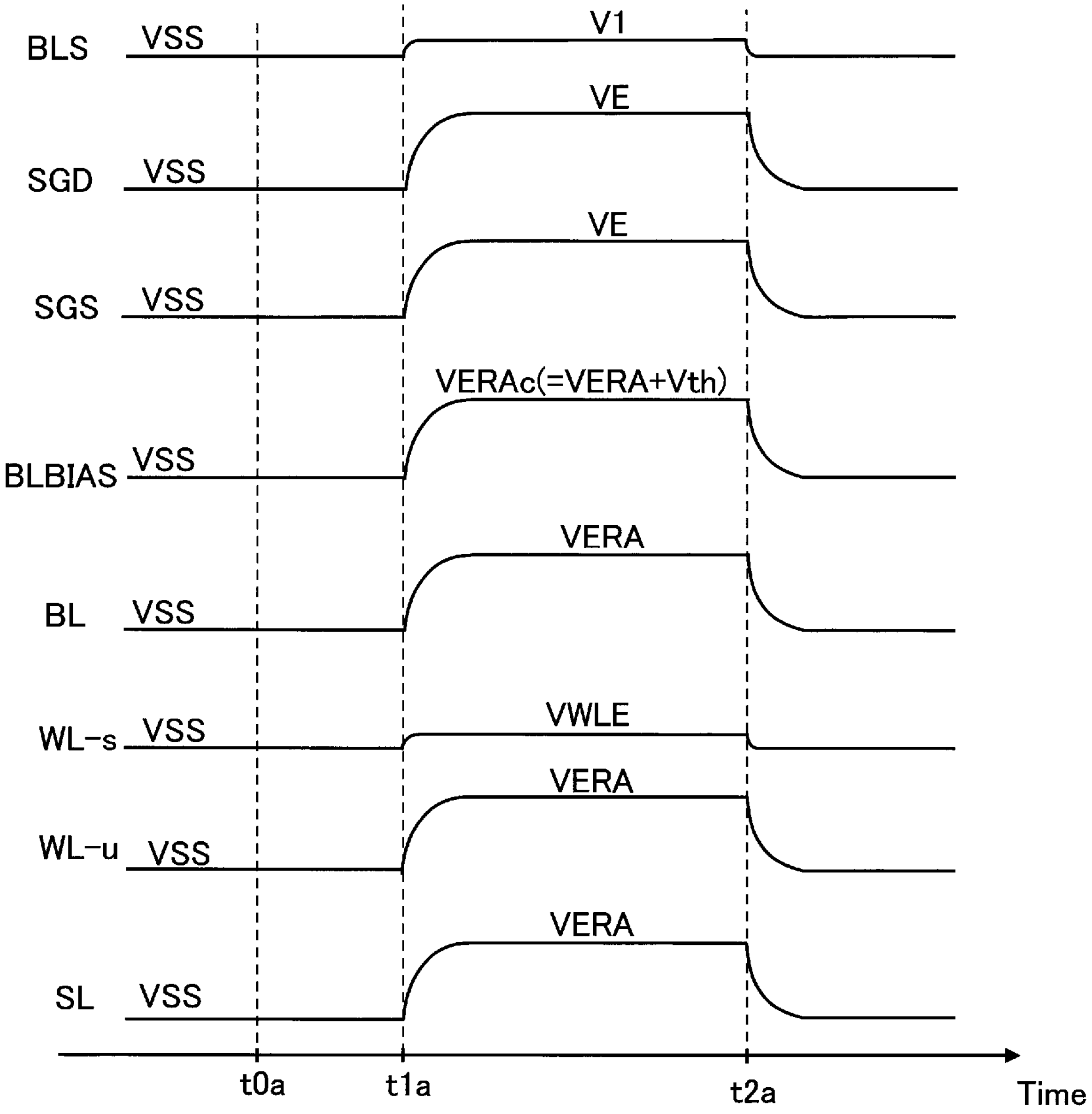
F I G. 10

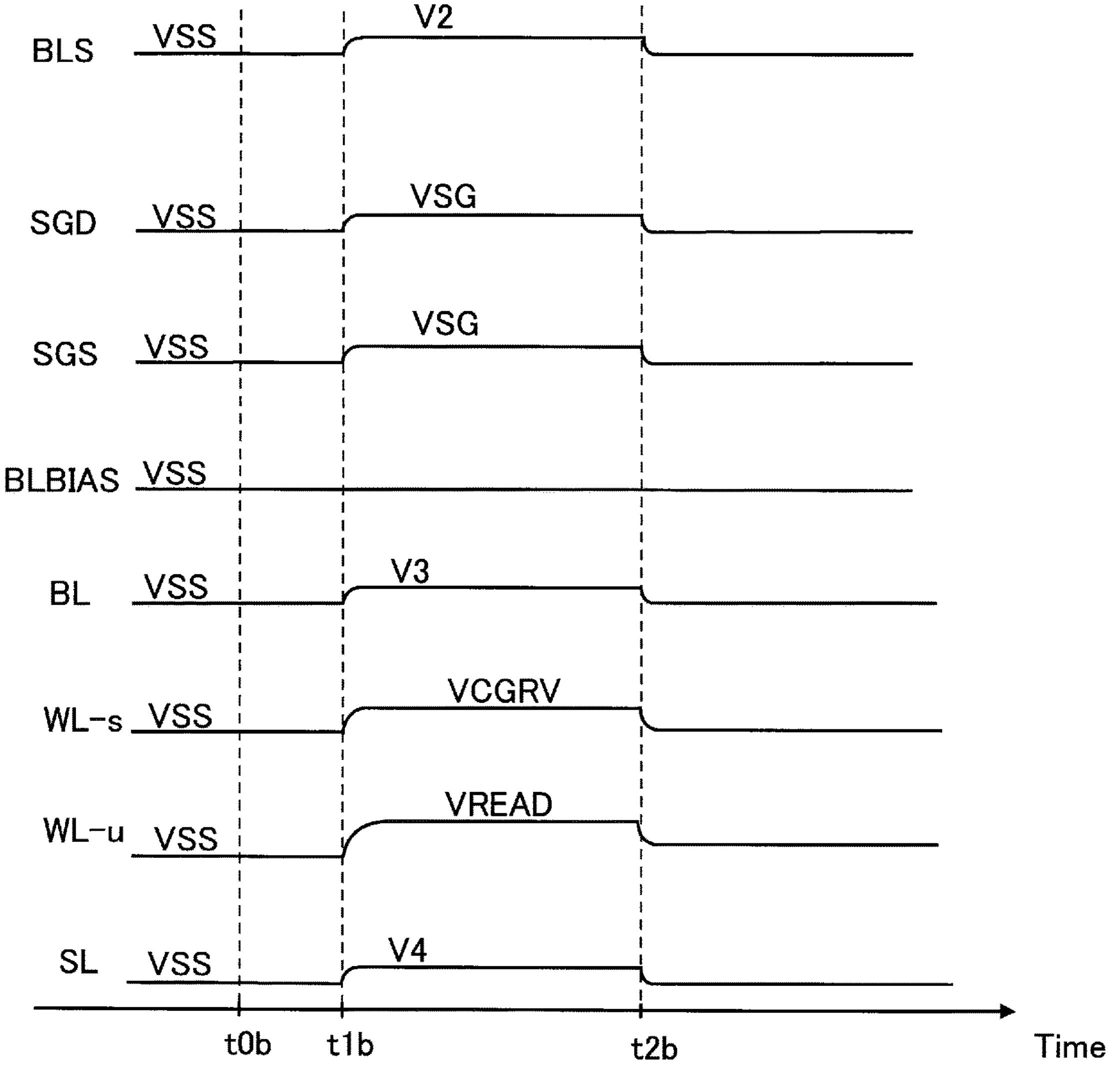
F I G. 11

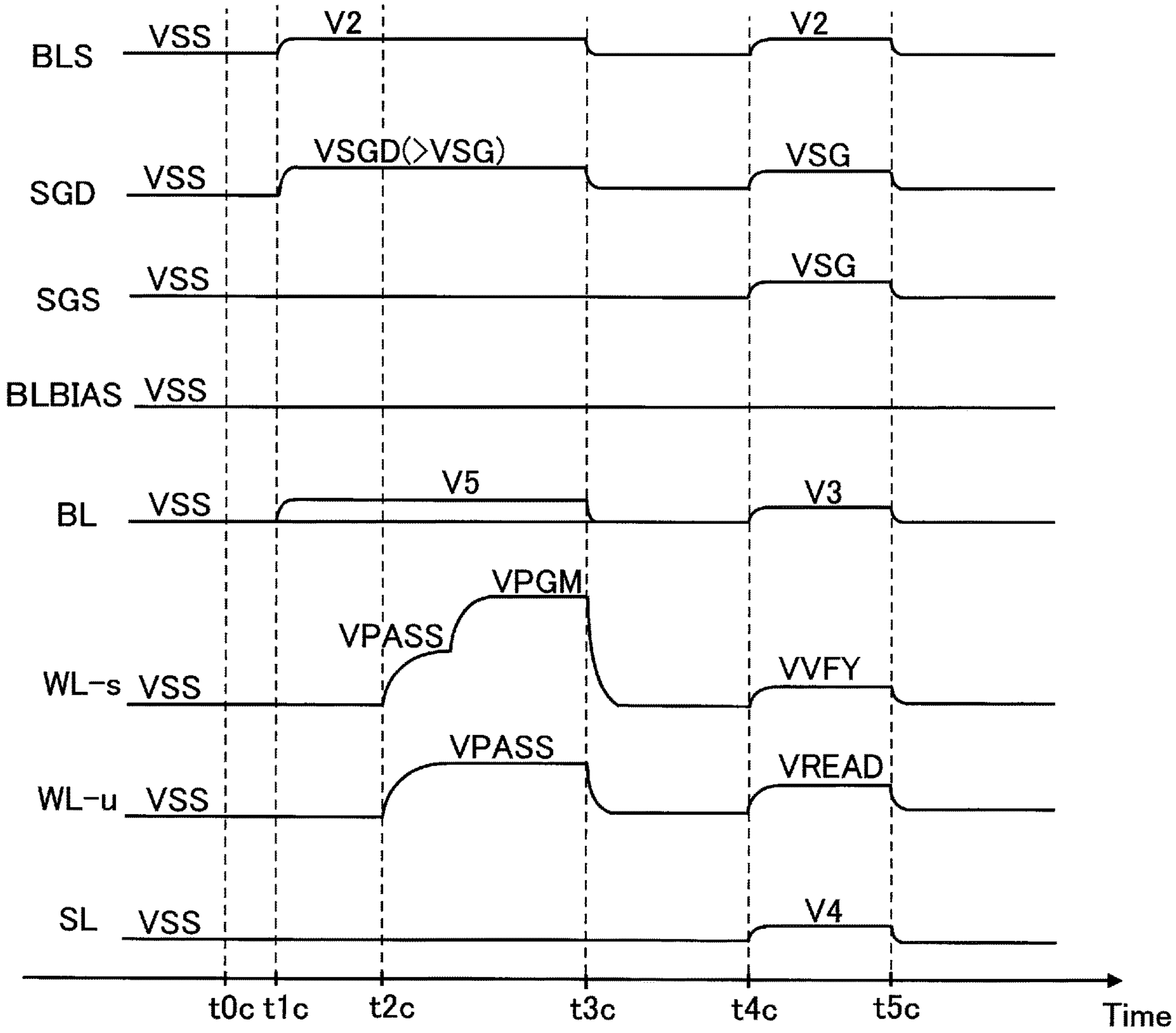
F I G. 12

| | BL capacitance [pF] | Ratio |
|---|---|---|
| M1-M2 | 0.0 | 0% |
| M1-M1_1st | 0.6 | 30% |
| M1-M1_2nd | 0.0 | 0% |
| M1-M1_3rd | 0.0 | 0% |
| PL-PL | 1.2 | 60% |
| PL-SGD | 0.2 | 10% |
| Others | 0.0 | 0% |
| Total | 2.0 | 100% |

FIG. 14

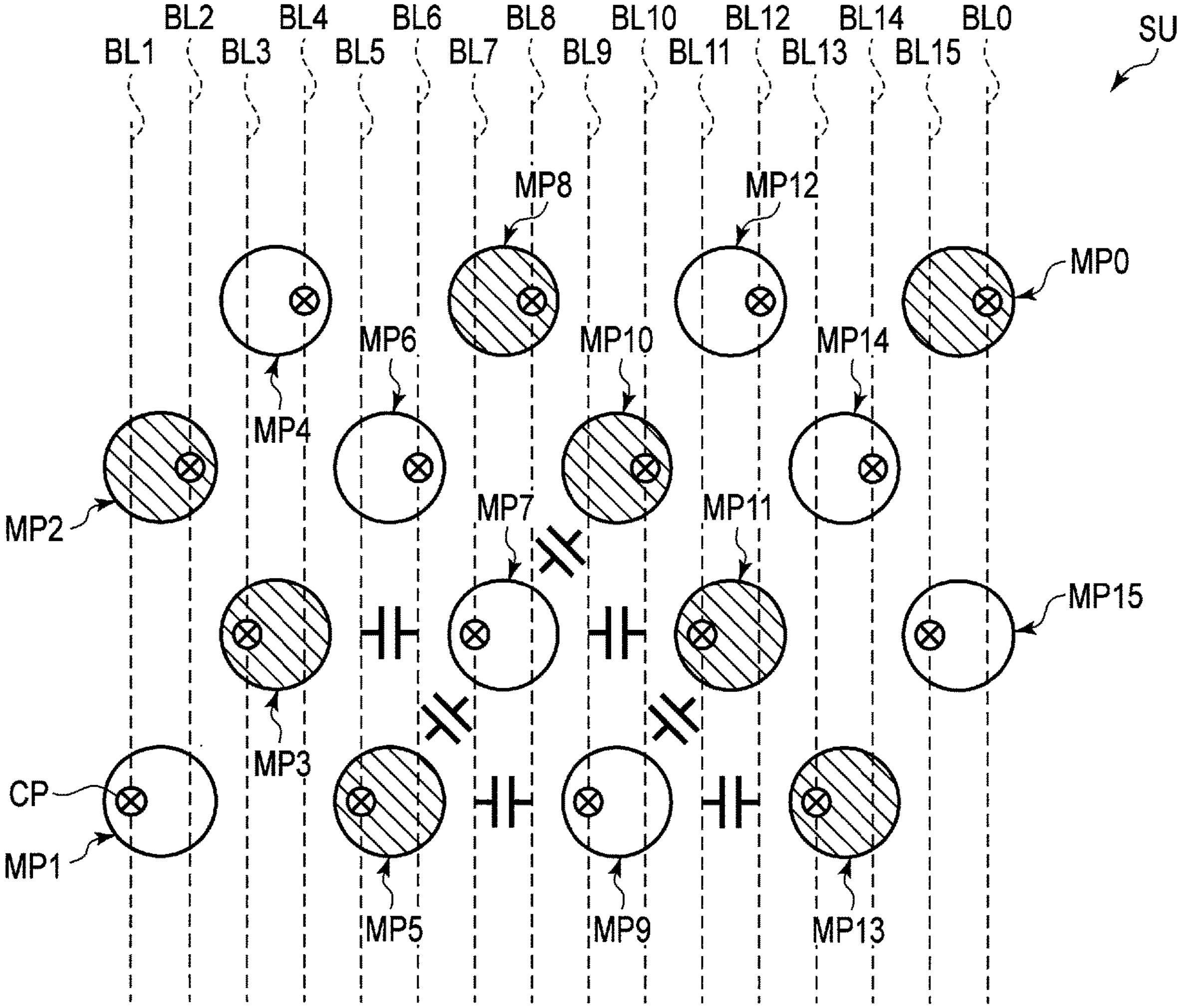
F I G. 15

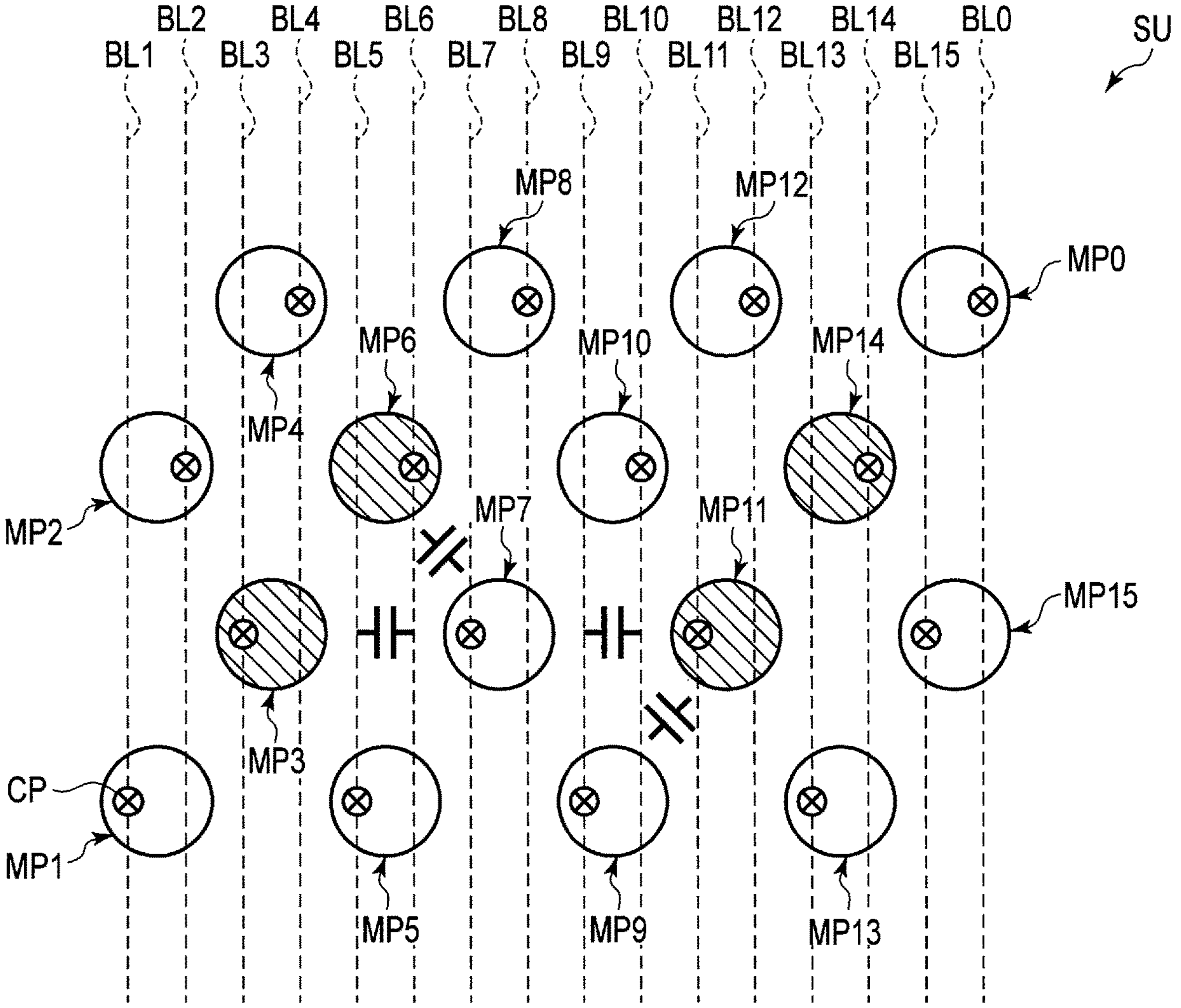
F I G. 17

| Number of transistors in relation to number of bit lines | Dimension of region where transistors are disposed | BL position | BL capacitance [pF] | Average BL capacitance [pF] | Voltage drop amount of VERA [V] |
|---|---|---|---|---|---|
| ALL | 60 | | | | 0 |
| 1/2 | 30 | BL7 | 1.300 | 1.35 | 0.148 |
| | | BL9 | 1.400 | | |
| 1/4 | 15 | BL7 | 1.100 | 0.75 | 0.267 |
| | | BL9 | 0.400 | | |

FIG. 18

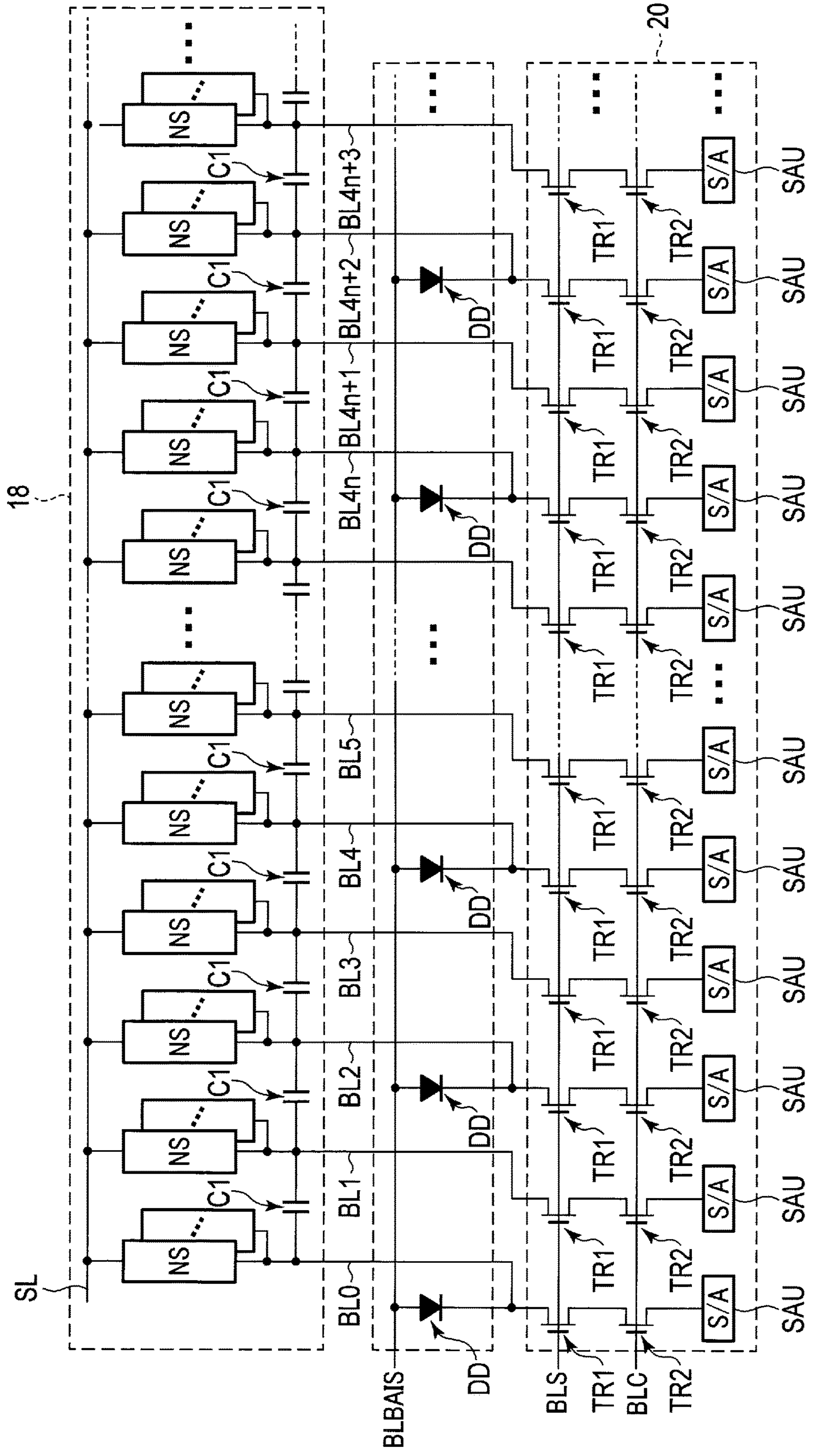
F I G. 19

SEMICONDUCTOR MEMORY

CROSS-REFERENCE TO RELATED APPLICATIONS

This application is based upon and claims the benefit of priority from Japanese Patent Application No. 2018-224042, filed Nov. 29, 2018, the entire contents of which are incorporated herein by reference.

FIELD

Embodiments described herein relate generally to a semiconductor memory.

BACKGROUND

There is known a NAND flash memory in which memory cells are arranged three-dimensionally.

BRIEF DESCRIPTION OF THE DRAWINGS

FIG. 1 is a view illustrating a system including a semiconductor memory of a first embodiment.

FIG. 2 is a view illustrating a configuration example of the semiconductor memory of the first embodiment.

FIG. 4 is a top view illustrating a configuration example of the semiconductor memory of the first embodiment.

FIG. 6, FIG. 7, FIG. 8 and FIG. 9 are views illustrating configuration examples of the semiconductor memory of the first embodiment.

FIG. 10, FIG. 11 and FIG. 12 are views illustrating operation examples of the semiconductor memory of the first embodiment.

FIG. 14 is a view for describing the semiconductor memory of the second embodiment.

FIG. 15, FIG. 16 and FIG. 17 are views illustrating configuration examples of the semiconductor memory of the second embodiment.

FIG. 18 is a view for describing the semiconductor memory of the second embodiment.

FIG. 19 and FIG. 20 are views illustrating modifications of the semiconductor memories of the embodiments.

DETAILED DESCRIPTION

Figure 3:
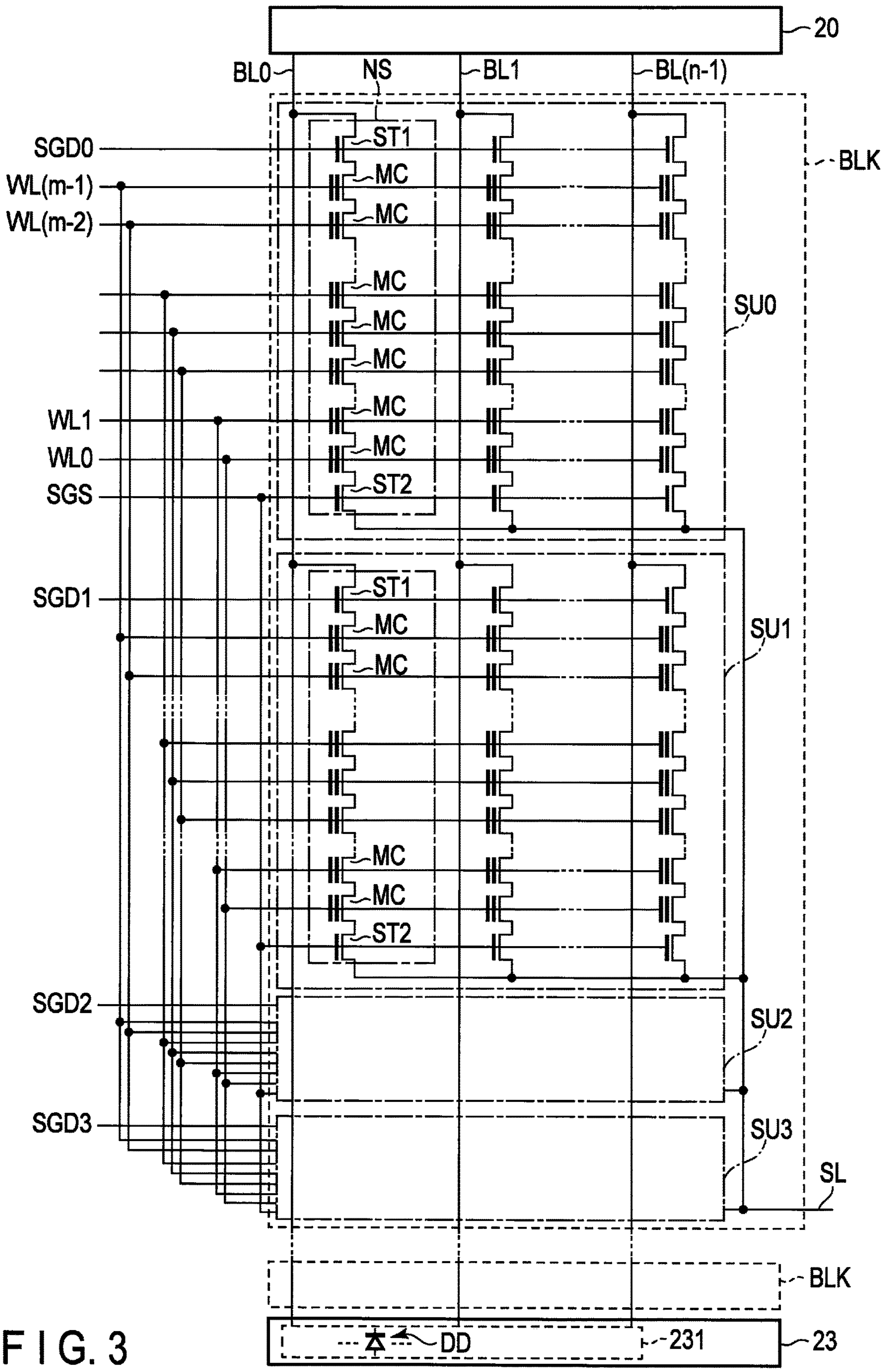
FIG. 3 is a circuit diagram illustrating an example of a memory cell array of the semiconductor memory of the first embodiment.

Semiconductor memory of embodiments will be described with reference to FIG. 1 to FIG. 20.

Hereinafter, the embodiments will be described in detail with reference to the accompanying drawings. In the description below, elements having the same function and structure are denoted by the same reference sign.

In addition, in each of the embodiments below, when structural elements (e.g. word lines WL, bit lines BL, various voltages, and signals), which are denoted by reference signs ending with numerals/alphabetical characters for distinction, do not need to be distinguished, expressions (reference signs) without such numerals/alphabetical characters at the ends are used.

In general, according to one embodiment, a semiconductor memory includes a first bit line; a first select transistor having a first terminal connected to the first bit line; a first memory cell connected to a second terminal of the first select transistor; a circuit connected to the first bit line and applying an erase voltage to be applied to the first memory cell to the bit line via the first terminal and the second terminal; and a diode connected to the first bit line and the first circuit.

(1) First Embodiment

Referring to FIG. 1 to FIG. 13, a semiconductor memory (memory device) of a first embodiment and a control method thereof will be described.

(a) Configuration

Referring to FIG. 1 to FIG. 10, a configuration of the semiconductor memory of the first embodiment will be described.

(a-1) Memory System

FIG. 1 is a schematic view illustrating a configuration example of a memory system including the semiconductor memory of the present embodiment.

FIG. 1 is a view illustrating the memory system of the present embodiment.

As illustrated in FIG. 1, a memory system 7 of the present embodiment includes a storage device 500 and a host device 600.

The host device 600 is coupled to the storage device 500 by, for example, a connector, a cable, wireless communication, or Internet. The host device 600 requests the storage device 500 to execute data writing, data reading and data erasing.

The storage device 500 includes a memory controller 5 and a semiconductor memory (memory device) 1.

The memory controller 5 causes the semiconductor memory 1 to execute an operation corresponding to the request of the host device 600. The memory controller 5 generates commands in order to cause the semiconductor memory 1 to execute operations. The memory controller 5 sends the generated commands to the semiconductor memory 1. The commands are signals indicative of operations to be executed by the semiconductor memory 1.

The memory controller 5 includes, for example, a processor (CPU), a built-in memory (e.g. DRAM), a buffer memory (e.g. SRAM) and an ECC circuit. The processor controls the operation of the entirety of the memory controller 5. The built-in memory stores programs (software/firmware), and management information (management table) of the storage device/semiconductor memory. The buffer memory temporarily stores data which is transmitted/received between the semiconductor memory 1 and host device 600. The ECC circuit detects an error in the data that is read from the semiconductor memory 1, and corrects the detected error.

The semiconductor memory 1 stores data. The semiconductor memory 1 executes data writing, data reading and data erasing, based on commands (requests of the host device 600) from the memory controller 5.

The semiconductor memory 1 is, for example, a NAND flash memory. The storage device 500 (or memory system 7) including the NAND flash memory 1 is, for example, a memory card (e.g. SD™ card, eMMC™), USB memory, or Solid State Drive (SSD).

Various kinds of signals are transmitted/received between the NAND flash memory 1 and memory controller 5. For example, a chip enable signal CEn, a command latch enable signal CLE, an address latch enable signal ALE, a write enable signal WEn and a read enable signal REn are used as control signals based on NAND interface standards between the flash memory 1 and memory controller 5.

The signal CEn is a signal for enabling a certain chip of the flash memory 1. The signal CLEn is a signal for notifying that a signal supplied to an I/O terminal (I/O line) IO<7:0> is a command. The signal ALEn is a signal for notifying that a signal supplied to the I/O terminal IO <7:0> is an address. The signal WEn is, for example, a signal which instructs an input of a signal via the I/O terminal IO<7:0>. The signal REn is, for example, a signal which instructs an output of a signal via the I/O terminal IO<7:0>.

Note that, in the description below, when the kind of signal that is input/output to/from, the I/O terminal is not distinguished, the signal that is input/output to/from the I/O terminal is also expressed as "I/O signal (or DQ signal)".

A ready/busy signal RBn is generated based on the operation state of the flash memory 1. The ready/busy signal RBn is sent from the flash memory 1 to the memory controller 5. The ready/busy signal RBn is a signal which notifies the memory controller 5 whether the flash memory 1 is in a ready state (a state in which the flash memory 1 accepts an instruction from the memory controller 5) or in a busy state (a state in which the flash memory 1 does not accept an instruction from the memory controller 5). For example, the ready/busy signal RBn is set at "L" (low) level (busy state) while the flash memory 1 is executing an operation of data reading or the like, and is set at "H" (high) level (ready state) if the operation is completed.

For example, a write protect signal (WPn) may also be transmitted/received between the NAND flash memory 1 and memory controller 5. The write protect signal is a signal for setting the flash memory 1 in a protected state, for example, at times of power ON and power OFF.

(a-2) Flash Memory

Referring to FIG. 2 to FIG. 10, a configuration example of the semiconductor memory of the present embodiment will be described.

<Internal Configuration>

FIG. 2 is a block diagram illustrating an example of a configuration of the semiconductor memory of the present embodiment.

As described above, the semiconductor memory of the present embodiment is a NAND flash memory.

As illustrated in FIG. 2, the NAND flash memory 1 includes an input/output circuit 10, a logic control circuit 11, a status register 12, an address register 13, a command register 14, a sequencer 15, a ready/busy circuit 16, a voltage generation circuit 17, a memory cell array 18, a row decoder 19, a sense amplifier 20, a data register 21, a column decoder 22, and an erase circuit 23.

The input/output circuit 10 controls the input/output of signals IO.

The input/output circuit 10 sends data (write data) DAT, which is received from the memory controller 5, to the data register 21. The input/output circuit 10 sends a received address ADD to the address register 13. The input/output circuit 10 sends a received command CMD to the command register 14. The input/output circuit 10 sends status information STS, which is received from the status register 12, to the memory controller 5. The input/output circuit 10 sends data (read data) DAT, which is received from the data register 21, to the memory controller 5. The input/output circuit 10 sends an address ADD, which is received from the address register 13, to the memory controller 5.

The logic control circuit 11 receives the chip enable signal CEn, command latch enable signal CLE, address latch enable signal ALE, write enable signal WEn and read enable signal REn. The logic control circuit 11 controls the input/output circuit 10 and sequencer 15 according to the received signals.

The status register 12 temporarily stores status information STS, for example, in data writing, data reading and data erasing operations. By the status information STS, the memory controller 5 is notified as to whether the operations are normally completed or not.

The address register 13 temporarily stores the address ADD which is received from the memory controller 5 via the input/output circuit 10. The address register 13 transfers a row address RA to the row decoder 19, and transfers a column address CA to the column decoder 22.

The command register 14 temporarily stores the command CMD which is received from the memory controller 5 via the input/output circuit 10. The command register 14 transfers the received command CMD to the sequencer 15.

The sequencer 15 controls the operation of the entirety of the NAND flash memory 1. The sequencer 15 controls, according to the command CMD, for example, the status register 12, ready/busy circuit 16, voltage generation circuit 17, row decoder 19, sense amplifier 20, data register 21, column decoder 22 and erase circuit 23. Thereby, the sequencer 15 executes the write operation, read operation and erase operation.

The ready/busy circuit 16 controls a signal level of the ready/busy signal R/Bn by the control of the sequencer 15 according to the operation state of the flash memory 1. The ready/busy circuit 16 sends the ready/busy signal R/Bn to the memory controller 5.

The voltage generation circuit 17 generates voltages for use in the write operation, read operation and erase operation according to the control of the sequencer 15. The voltage generation circuit 17 supplies the generated voltages to, for example, the memory cell array 18, row decoder 19 and sense amplifier 20. The row decoder 19 and sense amplifier 20 apply the voltages, which are supplied by the voltage generation circuit 17, to memory cells in the memory cell array 18.

For example, the voltage generation circuit 17 includes a plurality of charge pumps 170. Each of the charge pumps 170 may be configured to generate a voltage corresponding to an operation to be executed.

The memory cell array 18 includes a plurality of blocks BLK (BLK0, BLK1, . . . , BLK (k−1)) (k is an integer of 1 or more). Each block BLK includes memory cells (hereinafter, also referred to as "memory cell transistors") which are associated with rows and columns.

FIG. 3 is a schematic circuit diagram illustrating an example of the configuration of the memory cell array in the NAND flash memory of the present embodiment.

FIG. 3 is an equivalent circuit diagram for describing an example of the memory cell array of the NAND flash memory of the present embodiment.

As illustrated in FIG. 3, the block BLK includes, for example, four string units SU (SU0 to SU3). Each string unit SU includes a plurality of NAND strings NS. Each NAND string NS includes, for example, a plurality (e.g., m−1) of memory cells MC, and two select transistors ST1 and ST2. The number of select transistors ST1 and ST2 in the NAND string NS is freely selected, and it should suffice if at least one transistor ST1 and at least one transistor ST2 are provided. Symbol m is an integer of 1 or more.

The memory cell MC includes a control gate and a charge storage layer. Thereby, the memory cell MC stores data nonvolatilely. The memory cell MC may be a MONOS type which uses an insulation layer (e.g. a silicon nitride film) as the charge storage layer, or may be a floating-gate type which uses a conductive layer (e.g. a silicon layer) as the charge storage layer.

The memory cells MC are connected in series between the source of the select transistor ST1 and the drain of the select transistor ST2. Current paths of the memory cells MC are connected in series between the two select transistors ST1 and ST2. A terminal (e.g. a drain) of the current path of the memory cell MC, which is located most on the drain side in the NAND string NS, is connected to the source of the select transistor ST1. A terminal (e.g. a source) of the current path of the memory cell MC, which is located most on the source side in the NAND string NS, is connected to the drain of the select transistor ST2.

In each of the string units SU0 to SU3, the gate of the select transistor ST1 is connected to a corresponding one of drain-side select gate lines SGD0 to SGD3. In each of the string units SU0 to SU3, the gate of the select transistor ST2 is connected to one source-side select gate line SGS. In the description below, when the select gate lines SGD0 to SGD3 are not distinguished, each of the select gate lines SGD0 to SGD3 is expressed as "select gate line SGD". Note that mutually independent select gate lines SGS may be connected to the string units SU0 to SU3, respectively.

The control gate of a memory cell MC in the block BLK is connected to a corresponding one of word lines WL0 to WLm−1. In the description below, when the word lines WL0 to WLm−1 are not distinguished, each of the word lines WL0 to WLm−1 is expressed as "word line WL".

The drains of the select transistors ST1 of the respective NAND strings NS in the string unit SU are connected to different bit lines BL0 to BLn−1. Symbol n is an integer of 1 or more. In the description below, when the bit lines BL0 to BLn−1 are not distinguished, each of the bit lines BL0 to BLn−1 is expressed as "bit line BL". Each bit line BL is commonly connected to one NAND string NS in each string unit SU between the blocks BLK.

The sources of the select transistors ST2 are commonly connected to a source line SL. For example, the string units SU in the block BLK are connected to a common source line SL.

The string unit SU is a set of NAND strings NS which are connected to different bit lines BL and connected to identical select gate lines SGD and SGS. The block BLK is a set of string units SU having common word lines WL. The memory cell array 18 is a set of blocks BLK having common bit lines BL.

Data writing and data reading are executed batchwise with respect to memory cells MC connected to any one of word lines WL in a selected one of the string units SU. In the description below, a group of memory cells MC, which are selected batchwise when data writing and data reading are executed, are referred to as "memory cell group". A set of 1-bit data, which is written in one memory cell group or is read from one memory cell group, is referred to as "page". For example, one or more pages are allocated to one memory cell group.

Data erasing can be executed in units of the block BLK, or by a unit smaller than the block BLK. The method of data erasing is disclosed, for example, in U.S. patent application Ser. No. 13/235,389 filed Sep. 18, 2011 and entitled "NON-VOLATILE SEMICONDUCTOR MEMORY DEVICE". In addition, the method of data erasing is disclosed in U.S. patent application Ser. No. 12/694,690 filed Jan. 27, 2010 and entitled "NON-VOLATILE SEMICONDUCTOR STORAGE DEVICE". Besides, the method of data erasing is disclosed in U.S. patent application Ser. No. 13/483,610 filed May 30, 2012 and entitled "NONVOLATILE SEMICONDUCTOR MEMORY DEVICE AND DATA ERASE METHOD THEREOF". The entirety of these patent applications is incorporated in the present specification by reference.

Referring back to FIG. 2, the row decoder 19 decodes the row address RA. Based on the decoded result, the row decoder 19 controls activation/inactivation (selection/non-selection) of the blocks BLK, string units and word lines. The row decoder 19 transfers voltages for operations to the memory cell array 18 (block BLK).

The sense amplifier (sense amplifier module) 20 senses a signal which is output from the memory cell array 18 at a time of the read operation. Based on the sensed signal, data is determined. This data is used as read data. The sense amplifier 20 sends the read data to the data register 21. At a time of the write operation, the sense amplifier 20 can control the potentials of the bit lines BL of the memory cell array 18, based on write data. For example, the sense amplifier 20 includes a plurality of sense amplifier circuits SAU. One sense amplifier circuit SAU is connected to one or more corresponding bit lines.

The data register 21 stores write data and read data. For example, in the write operation, the data register 21 transfers the write data, which is received from the input/output circuit 10, to the memory cell array 18. For example, in the read operation, the data register 21 transfers the read data RD, which is received from the sense amplifier 20, to the input/output circuit 10.

The column decoder 22 decodes the column address CA. The column decoder 22 can control the sense amplifier 20 and data register 21 according to the decoded result.

The erase circuit 23 controls the erase operation. At the time of the erase operation, the erase circuit 23 transfers an erase voltage to the memory cell array 18. In the present embodiment, the erase circuit 23 is connected to the bit lines BL. The erase circuit 23 applies the erase voltage to the bit line BL. The erase circuit 23 includes a diode circuit 231 which includes a plurality of diodes DD. The erase voltage is applied to the bit line BL from the diode circuit 231.

For example, there is a case where the NAND flash memory 1 includes a control unit called "plane PLN". One plane PLN includes, for example, the memory cell array 18, row decoder 19, sense amplifier 20, data register 21 and column decoder 22. In the example of the NAND flash memory 1 in FIG. 2, only one plane PLN is illustrated. However, the NAND flash memory 1 may include two or more planes PLN. When the NAND flash memory 1 includes a plurality of planes PLN, each plane PLN can execute a different operation at a different timing by the control of the sequencer 15.

Configuration Example

Figure 5:
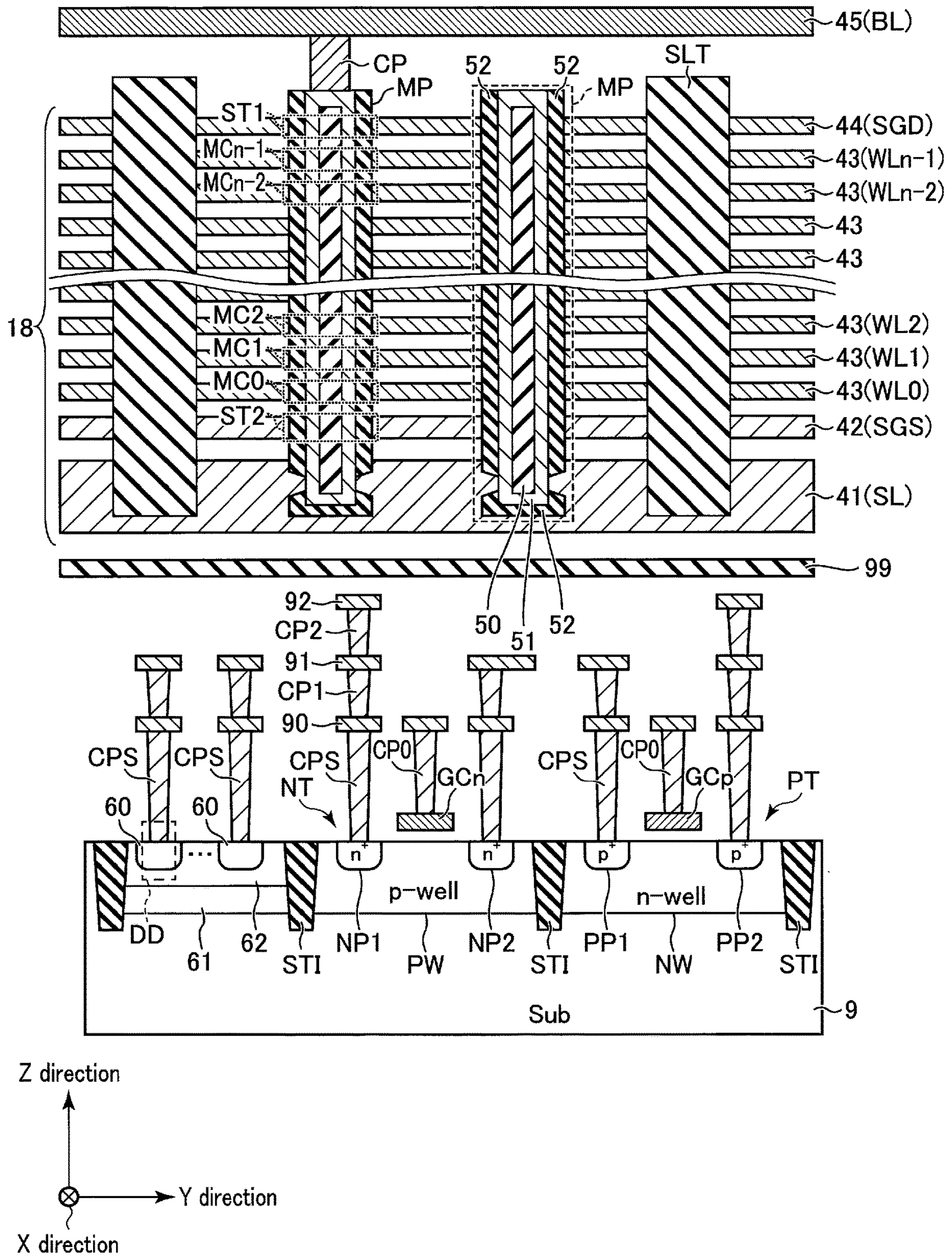
FIG. 5 is a cross-sectional view illustrating a configuration example of the semiconductor memory of the first embodiment.

Referring to FIG. 4 to FIG. 6, a description will be given of a configuration example of the NAND flash memory of the embodiment.

FIG. 4 is a top view illustrating an example of a plan-view layout of the memory cell array 18 of the flash memory 1 of the embodiment. In FIG. 4, structures corresponding to the two string units SU0 and SU1, respectively, are illustrated in an extracted manner.

As illustrated in FIG. 4, in a region in which the memory cell array 18 is formed, for example, a plurality of slits SLT, a plurality of string units SU, and a plurality of bit lines BL are provided.

The slits SLT extend in an X direction. The slits SLT are arranged in a Y direction. For example, one string unit SU is disposed between two slits SLT which are arranged in the Y direction. The X direction is a direction parallel to the surface of a semiconductor substrate. The Y direction is a direction which is parallel to the surface of the semiconductor substrate and crosses (e.g. at right angles) the X direction. A Z direction is a direction substantially perpendicular to the surface (X-Y plane) of the semiconductor substrate.

Each string unit SU includes a plurality of memory pillars MP. The memory pillars MP are arranged, for example, in a staggering fashion in the X-Y plane. One memory pillar MP is used, for example, as one NAND string NS.

The bit lines BL extend in the Y direction. The bit lines BL are arranged in the X direction. For example, each bit line BL is disposed in a manner to overlap at least one memory pillar MP in each string unit SU in the Z direction. For example, two bit lines BL overlap one memory pillar MP.

In one string unit, a contact plug CP is provided between one bit lines BL and one memory pillar MP. Each memory pillar MP is electrically connected to one corresponding bit line BL via the contact plug CP.

The number of string units SU, which are provided between two slits SLT, may be designed to be a freely selected number. The number of memory pillars MP and the layout of the memory pillars MP illustrated in FIG. 4 are merely examples, and the number of memory pillars MP and the layout of the memory pillars MP may be freely designed. The number of bit lines BL, which overlap one memory pillar MP, may be designed to be a freely selected number.

FIG. 5 is a cross-sectional view illustrating an example of a cross-sectional configuration of the memory cell array 18 of the flash memory of the embodiment.

As illustrated in FIG. 5, the memory cell array 18 is provided above a semiconductor substrate 9 in the Z direction. The memory cell array 18 includes, for example, a plurality of conductive layers 41 to 45, and a plurality of memory pillars MP.

The conductive layer 41 is provided above the semiconductor substrate 9 in the Z direction. For example, the conductive layer 41 has a plate shape extending along an XY plane that is parallel to the surface of the semiconductor substrate 9. The conductive layer 41 is used as a source line SL of the memory cell array 18. The conductive layer 41 includes, for example, silicon (Si). For example, a carrier density of the source line SL is relatively low.

The conductive layer 42 is provided above the conductive layer 41 in the Z direction via an insulation layer (not shown). For example, the conductive layer 42 has a plate shape extending along the XY plane. The conductive layer 42 is used as a select gate line SGS. The conductive layer 42 includes, for example, silicon (Si).

Insulation layers (not shown) and the conductive layers 43 are alternately stacked in the Z direction above the conductive layer 42. For example, each of the conductive layers 43 has a plate shape extending along the XY plane. The stacked conductive layers 43 are used as word lines WL0 to WLm−1 in the order from the semiconductor substrate 9 side. The conductive layers 43 include, for example, tungsten (W).

The conductive layer 44 is provided via an insulation layer (not shown) above the uppermost conductive layer 43 of the stacked conductive layers 43. The conductive layer 44 has a plate shape extending along the XY plane. The conductive layer 44 is used as a select gate line SGD. The conductive layer 44 includes, for example, tungsten (W).

The conductive layer 45 is provided via an insulation layer (not shown) above the conductive layer 44 in the Z direction. For example, the conductive layer 45 has a line shape extending along the Y direction. The conductive layer 45 is used as a bit line BL. As described above, a plurality of conductive layers 45 functioning as bit lines BL are arranged in the X direction. The conductive layers 45 include, for example, copper (Cu).

The memory pillar (member) MP has a columnar structure (shape) extending in the Z direction. The memory pillar MP penetrates, for example, the conductive layers 42 to 44. An upper end of the memory pillar MP is provided, for example, between a region (position/height in the Z direction) where the conductive layer 44 is provided, and a region (position/height in the Z direction) where the conductive layer 45 is provided. A lower end of the memory pillar MP is provided, for example, in a region where the conductive layer 41 is provided.

The memory pillar MP includes, for example, a core layer 50, a semiconductor layer 51 and a multilayer film 52.

The core layer 50 has a columnar structure extending in the Z direction. An upper end of the core layer 50 is provided, for example, in a region above the region (position/height) where the conductive layer 44 is provided. A lower end of the core layer 50 is provided, for example, in the region where the conductive layer 41 is provided. The core layer 50 includes, for example, an insulator such as silicon oxide ($SiO_2$).

The semiconductor layer 51 covers the core layer 50. The semiconductor layer 51 is put in direct contact with the conductive layer 41, for example, on a side surface (a surface substantially perpendicular to the XY plane) of the memory pillar MP. The semiconductor layer 51 includes, for example, silicon (Si).

The multilayer film 52 covers the side surface and bottom surface of the semiconductor layer 51, except the part where the conductor layer 41 and semiconductor layer 51 are put in contact.

FIG. 6 illustrates an example of a cross-sectional structure of the memory pillar in a cross section which is parallel to the surface of the semiconductor substrate 9 and includes the conductive layer 43.

As illustrated in FIG. 6, in a region including the conductive layer 43, the core layer 50 is provided in a central portion of the memory pillar MP. The semiconductor layer 51 surrounds the side surface of the core layer 50. The multilayer film 52 surrounds the side surface of the semiconductor layer 51. The multilayer film 52 includes, for example, a tunnel insulation film 521, a charge storage layer 522 and a block insulation film 523.

The tunnel insulation film 521 surrounds the side surface of the semiconductor layer 51. The charge storage layer 522 surrounds the side surface of the tunnel insulation film 521. The block insulation film 523 surrounds the charge storage layer 522. The conductive layer 43 surrounds the side surface of the block insulation film 523.

The tunnel insulation film 521 includes, for example, silicon oxide ($SiO_2$). The charge storage layer 522 includes, for example, an insulation film such as silicon nitride (SiN). The block insulation film 523 includes, for example, silicon oxide ($SiO_2$) or aluminum oxide ($Al_2O_3$).

Referring back to FIG. 5, the columnar contact plug CP is provided on the semiconductor layer 51. In the region illustrated in FIG. 5, the contact plug CP corresponding to one memory pillar MP of two memory pillars MP is illustrated. The memory pillar MP, which is not connected to the contact plug CP in FIG. 5, is connected to a contact plug CP in the viewer-side direction or in the depth direction of the drawing sheet of FIG. 5.

A top surface of the contact plug CP is put in contact with one conductive layer 45 (one bit line BL). Note that the memory pillar MP may be electrically connected to the conductive layer 45 via two or more contract plugs, or may be electrically connected to the conductive layer 45 via some other interconnect.

The slit SLT has a plate-shaped structure extending in the Z direction. The slit SLT divides, for example, the conductive layers 42 to 44 into two regions. An upper end of the slit SLT is disposed, for example, between a region including the upper end of the memory pillar MP and a region where the conductive layer 45 is provided. A lower end of the slit SLT is disposed, for example, in a region where the conductive layer 41 is provided. An insulation layer is provided in the inside of the slit SLT. The insulation layer includes, for example, silicon oxide ($SiO_2$). Note that an insulation layer including a plurality of kinds of insulators may be provided in the slit SLT.

In the structure of the memory pillar MP, for example, a part of an intersection between the memory pillar MP and the conductive layer 42 functions as the select transistor ST2. A part of an intersection between the memory pillar MP and the conductive layer 43 functions as the memory cell (memory cell transistor) MC. A part of an intersection between the memory pillar MP and the conductive layer 44 functions as the select transistor ST1. The semiconductor layer 51 is used as a channel region of each of the memory cells MC and select transistors ST1 and ST2. The charge storage layer 522 is used as a charge storage layer of the memory cell MC.

Note that in the structure of the memory cell array 18, the number of conductive layers 43 is designed based on the number of word lines WL. The select gate line SGD may be composed of a plurality of conductive layers 44. The select gate line SGS may be composed of a plurality of conductive layers 42. When the select gate line SGS is composed of a plurality of conductive layers, a conductor different from the conductive layer 42 may be used for the select gate line SGS.

The configuration of the memory cell array 18 may be other configuration. For example, the configuration of the memory cell array 18 is disclosed in U.S. patent application Ser. No. 12/407,403 filed Mar. 19, 2009 and entitled "THREE DIMENSIONAL STACKED NONVOLATILE SEMICONDUCTOR MEMORY". In addition, the configuration of the memory cell array 18 is disclosed in U.S. patent application Ser. No. 12/406,524 filed Mar. 18, 2009 and entitled "THREE DIMENSIONAL STACKED NON-VOLATILE SEMICONDUCTOR MEMORY", in U.S. patent application Ser. No. 12/679,991 filed Mar. 25, 2010 and entitled "NON-VOLATILE SEMICONDUCTOR STORAGE DEVICE AND METHOD OF MANUFACTURING THE SAME", and in U.S. patent application Ser. No. 12/532,030 filed Mar. 23, 2009 and entitled "SEMICONDUCTOR MEMORY AND METHOD FOR MANUFACTURING THE SAME". The entire descriptions of these patent applications are incorporated by reference herein.

As illustrated in FIG. 5, constituent elements of the NAND flash memory 1 may be provided below the memory cell array 18.

A plurality of elements NT, PT and DD are provided in a plurality of regions of a semiconductor substrate (e.g. a silicon substrate) 9 below the memory cell array 18. The elements NT, PT and DD constitute circuitry of the NAND flash memory.

An interlayer insulation film (not shown) is provided on a top surface of the semiconductor substrate 9. The elements NT, PT and DD are covered with the interlayer insulation film. For example, the interlayer insulation film includes a barrier layer 99. The barrier layer 99 is an insulation layer. The barrier layer 99 is provided between the memory cell array 18 and the semiconductor substrate 9. When the structure body corresponding to the memory cell array 18 is formed in the manufacturing process of the flash memory 1, the barrier layer 99 prevents a substance (e.g. impurities such as hydrogen) in the structure body 18 from moving into the circuitry of the semiconductor substrate 9, or prevents a substance in the circuitry from moving into the structure boy 18. The barrier layer 99 includes, for example, silicon nitride (SiN).

In the semiconductor substrate 9, for example, well regions (impurity semiconductor regions) PW, NW and 61 and element isolation regions STI are provided. Conductive layers GC (GCn, GCp), 90, 91 and 92, and contact plugs CPS, CP0, CP1 and CP2 are provided above the semiconductor substrate 9.

The element isolation region STI is provided between the n-type well region NW and p-type well region PW. By the element isolation region STI, the two well regions NW and PW are electrically isolated.

An n-type field-effect transistor NT (hereinafter, also referred to as "n-type transistor") is provided on the p-type well region PW of the semiconductor substrate 9.

In the p-type well region PW, $n^+$ diffusion layers (impurity semiconductor regions) NP1 and NP2 are provided. The $n^+$ diffusion layer NP1 is spaced apart from the $n^+$ diffusion layer NP2. The $n^+$ diffusion layers NP1 and NP2 are in contact with the top surface of the semiconductor substrate 9. In the $n^+$ diffusion layers NP1 and NP2, for example, phosphorus (P) is doped. The conductive layer GCn is provided above the p-type well region PW between the $n^+$ diffusion layers NP1 and NP2 via a gate insulation film (not shown). The $n^+$ diffusion layer NP1, NP2 is used as a source/drain layer of the n-type transistor NT. The conductive layer CGn is used as the gate electrode of the n-type transistor NT.

A p-type field-effect transistor PT (hereinafter, also referred to as "p-type transistor") is provided on the n-type well region NW of the semiconductor substrate 9.

In the n-type well region NW, $p^+$ diffusion layers (impurity semiconductor regions) PP1 and PP2 are provided. The $p^+$ diffusion layer PP1 is spaced apart from the $p^+$ diffusion layer PP2. The $p^+$ diffusion layers PP1 and PP2 are in contact with the top surface of the semiconductor substrate 9. In the $p^+$ diffusion layers PP1 and PP2, for example, boron (B) is doped. The conductive layer GCp is provided above the n-type well region NW between the $p^+$ diffusion layers PP1 and PP2 via a gate insulation film (not shown). The $p^+$ diffusion layer PP1, PP2 is used as a source/drain layer of the p-type transistor PT. The conductive layer CGp is used as the gate electrode of the p-type transistor.

The conductive layers 90, 91 and 92 are provided in the interlayer insulation film (not shown) on the semiconductor substrate 9. The conductive layer 90 is provided in a layer above the conductive layers GCn and GCp. The conductive layer 91 is provided in a layer above the conductive layer 90. The conductive layer 92 is provided in a layer above the conductive layer 91. The conductive layers 90, 91 and 92 are interconnects for connecting elements or for connecting circuits.

Each of the contact plugs CPS is provided between the semiconductor substrate 9 and conductive layer 90. For example, the contact plugs CPS are electrically connected to the $n^+$ diffusion layers NP1 and NP2 and $p^+$ diffusion layers PP1 and PP2, respectively. Each of the contact plugs CP0 is provided between the conductive layer GCn, GCp and the conductive layer 90. Each of the contact plugs CP1 is provided between the conductive layer 90 and the conductive layer 91. Each of the contact plugs CP2 is provided between the conductive layer 91 and the conductive layer 92. Each of the contact plugs CPS, CP0, CP1 and CP2 is a columnar conductor. By the contact plugs CPS, CP0, CP1 and CP2, conductive layers of different interconnect levels (heights with reference to the surface of the semiconductor substrate 9) are electrically connected.

For example, a diode DD is provided in the semiconductor substrate 9. The diode DD includes impurity semiconductor regions (well regions and/or a diffusion layer) 60, 61 and 62 in the semiconductor substrate 9.

For example, the n-type well region 61 is provided in the semiconductor substrate 9. The p-type well region 62 is provided in the n-type well region 61. The $n^+$ diffusion layer 60 is provided in the p-type well region 62. The $n^+$ diffusion layer 60 is connected to an upper-layer interconnect such as the conductive layer 90 via the contact plug CPS. The p-type well region 62 is used as an anode of the diode DD. The $n^+$ diffusion layer 60 is used as a cathode of the diode DD.

The flash memory 1 of the present embodiment includes diodes which are connected to the bit lines BL. In the present embodiment, the diodes DD are used, for example, in the erase circuit 23. The erase circuit 23 includes the circuit 231 including a plurality of diodes.

In the flash memory 1 of the present embodiment, an erase voltage (VERA) is supplied to the bit lines BL via the diodes DD.

Thereby, the flash memory 1 of the present embodiment can execute an erase operation which utilizes hot carriers due to GIDL (Gate Induced Drain Leakage), by reducing the circuit area.

Hereinafter, a configuration of the erase circuit of the flash memory of the present embodiment will be described.

<Erase Circuit>

Figure 7:
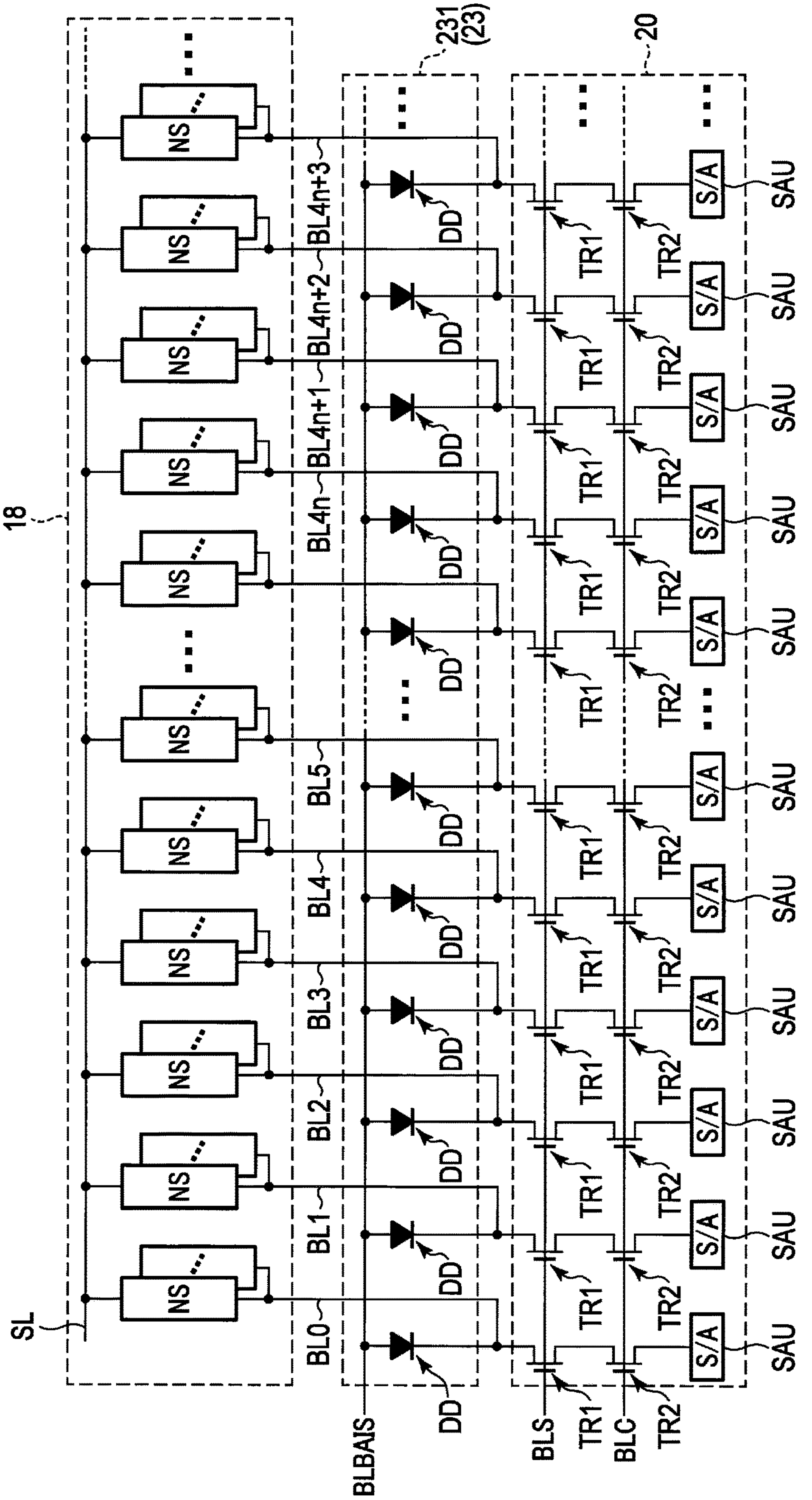

FIG. 7 is a schematic view illustrating a basic configuration of the erase circuit in the NAND flash memory of the present embodiment.

In FIG. 7, the depictions of the blocks, string units, NAND strings, etc. of the memory cell array 18 are omitted or simplified.

As illustrated in FIG. 7, the bit line BL is connected to the NAND string NS and also connected to the sense amplifier 20 and erase circuit 23.

The sense amplifier 20 includes a plurality of sense amplifier circuits (sense amplifier units) SAU. One bit line BL is connected to one corresponding sense amplifier circuit of the sense amplifier circuits.

The sense amplifier 20 includes a plurality of transistors (e.g. n-type transistors) TR1.

The current path (source-drain) of one corresponding transistor TR1 of the transistors TR1 is connected between one bit line BL and one sense amplifier circuit SAU.

The gates of the transistors TR1 are connected to a common interconnect (control line) BLS. The transistors TR1, which are commonly connected to the interconnect BLS, are set batchwise in the ON state or OFF state in accordance with the potential (signal level) of the interconnect BLS. The transistor TR1 that is in the ON state electrically connects the sense amplifier circuit SAU and bit line BL. The transistor TR1 that is in the OFF state electrically disconnects the sense amplifier circuit SAU from the bit line BL.

The transistor TR1 transfers a voltage from the sense amplifier circuit SAU to the bit line BL at a time of a write operation and at a time of a read operation. At a time of an erase operation, the transistor TR1 prevents a relatively high voltage from being transferred to the sense amplifier circuit SAU. In the description below, the transistor TR1 is also referred to as "bias transistor".

For example, the transistor TR1 is a high breakdown voltage transistor. The high breakdown voltage transistor is designed such that even if a relatively high voltage (e.g. 10 V to 30 V) is applied to the drain (bit line side) of the transistor at a time of operation (e.g. at a time of the erase operation), the transistor is set in the OFF state and a leak is suppressed low. Thus, the high breakdown voltage transistor has a relatively large size (e.g. the area of a semiconductor region in which the high breakdown voltage transistor is disposed). Thereby, the transistor TR1 functioning as the high breakdown voltage transistor has a high dielectric breakdown strength.

The sense amplifier 20 includes a plurality of transistors (e.g. n-type transistors) TR2.

Each transistor TR2 is provided between a corresponding sense amplifier SAU and a corresponding transistor TR1. One terminal of the transistor TR2 is connected to the sense amplifier circuit SAU, and the other terminal of the transistor TR2 is connected to the current path of the transistor TR1. A control signal BLC is supplied to the gate of the transistors TR2. The ON/OFF of the transistors TR2 are controlled in accordance with the signal level of the control signal BLC.

The transistor TR2 is configured to clamp the potential of the bit line BL. Hereinafter, the transistor TR2 is also referred to as "clamp transistor". The clamp transistor TR2 is a low breakdown voltage transistor. The dielectric breakdown strength of the low breakdown voltage transistor may be lower than the dielectric breakdown strength of the high breakdown voltage transistor. Accordingly, the size (e.g. the area of a semiconductor region in which the low breakdown voltage transistor is disposed) of the low breakdown voltage transistor is smaller than the area of the high breakdown voltage transistor.

The erase circuit 23 includes the diode circuit 231. The diode circuit 231 is connected to the bit lines BL. The diode circuit 231 includes a plurality of diodes DD. For example, the number of diodes DD in the diode circuit 231 is equal to the number of bit lines BL in the memory cell array 18.

One diode DD is connected to one corresponding bit line BL of the bit lines BL. The anode of the diode DD is connected to an interconnect (node) BLBIAS, and the cathode of the diode DD is connected to the bit line BL. A voltage having a certain voltage value is applied to the interconnect BLBIAS in accordance with an operation for the memory cell array. The diode DD has a threshold voltage Vf.

In the flash memory 1 of the present embodiment, when the erase operation is executed, the diode DD applies an erase voltage VERA to the bit line BL. The erase voltage VERA has a voltage value of, for example, about 20 V to 25 V. The diode DD may be designed so as to be capable of transferring the erase voltage VERA having a relatively high voltage value.

The area of the semiconductor region where the diode DD is provided is smaller than the area of the semiconductor region where the transistor (high breakdown voltage transistor) is provided.

Figure 8:
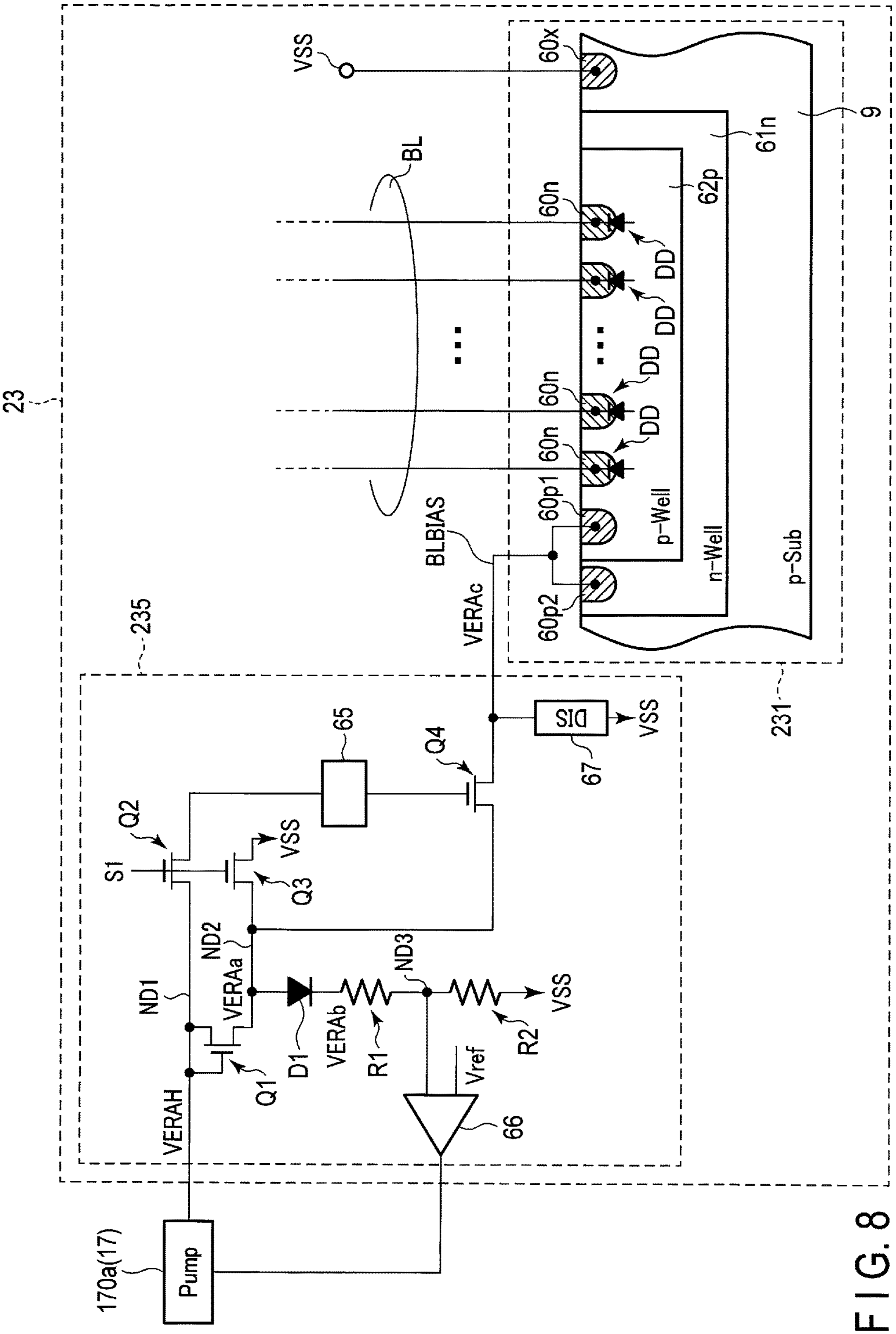

FIG. 8 is a schematic circuit diagram for describing a configuration example of the erase circuit in the NAND flash memory of the present embodiment.

As illustrated in FIG. 8, the erase circuit 23 includes, for example, the diode circuit 231 and a voltage control circuit 235.

The voltage control circuit 235 is connected to the voltage generation circuit 17. The voltage control circuit 235 receives a voltage VERAH from a charge pump 170*a* among the charge pumps of the voltage generation circuit 17.

The voltage control circuit 235 includes a transfer circuit 65, a comparison circuit 66, a discharge circuit 67, a plurality of field-effect transistors Q1, Q2, Q3 and Q4, a diode D1, and a plurality of resistors (resistance elements) R1 and R2.

The gate and one terminal of the transistor Q1 are connected to a node ND1. The other terminal of the transistor Q1 is connected to a node ND2.

One terminal of the transistor Q2 is connected to the node ND1. The other terminal of the transistor Q2 is connected to the transfer circuit 65. A signal S1 is supplied to the gate of the transistor Q2.

One terminal of the transistor Q3 is connected to the node ND2. The other terminal of the transistor Q3 is connected to a terminal to which a ground voltage VSS is applied. The signal S1 is supplied to the gate of the transistor Q3. In the description below, the terminal to which the ground voltage VSS is applied is referred to as "ground terminal".

One terminal of the transistor Q4 is connected to the node ND2. The other terminal of the transistor Q4 is connected to an interconnect BLBAIS. The gate of the transistor Q4 is connected to the transfer circuit 65.

For example, the transistors Q1, Q2, Q3 and Q4 are n-type high breakdown voltage transistors. Note that the transistors Q1, Q2, Q3 and Q4 may be p-type high breakdown voltage transistors.

The transfer circuit 65 transfers the output voltage of the transistor Q2 to the gate of the transistor Q4. For example, the transfer circuit 65 includes a p-type field-effect transistor (e.g. a high breakdown voltage transistor). The output voltage of the transistor Q2 is transferred to the gate of the transistor Q4 via the current path of the p-type transistor.

The anode of the diode D1 is connected to the node ND2. The cathode of the diode D1 is connected to one terminal of the resistor R1. The other terminal of the resistor R1 is connected to a node ND3. One terminal of the resistor R2 is connected to the node ND3. The other terminal of the resistor R2 is connected to a ground terminal VSS. The diode D1 has a threshold voltage Vth.

One input terminal of the comparison circuit 66 is connected to the node ND3. The other input terminal of the comparison circuit 66 is connected to a terminal to which a reference voltage Vref is applied. An output terminal of the comparison circuit 66 is connected to the charge pump 170*a*. The comparison circuit 66 compares the reference voltage Vref and the potential of the node ND3. The comparison circuit 66 outputs a comparison result to the charge pump 170*a*.

One terminal of the discharge circuit 67 is connected to the interconnect BLBIAS. The other terminal of the discharge circuit 67 is connected to a ground terminal. The discharge circuit 67 can set the interconnect BLBIAS in a discharge state. For example, the discharge circuit 67 includes an n-type field-effect transistor (e.g. a high breakdown voltage transistor).

In consideration of a voltage drop due to the threshold voltage (forward voltage) Vf of the diode DD, it is preferable that a sum (voltage VERA+Vf) of the erase voltage VERA and the threshold voltage Vf of the diode DD is supplied to the interconnect BLBIAS at the time of the erase operation.

Thus, the voltage control circuit 235 controls the value of voltage which is applied to the interconnect BLBIAS, as described below.

At the time of the erase operation, the voltage VERAH from the charge pump 170*a* is supplied to the node ND1. For example, at the time of starting the control of the voltage value of the erase voltage VERA, the transistors Q2 and Q3 are set in the OFF state by the signal S1. Accordingly, the transistor Q4 is set in the OFF state. The interconnect BLBIAS is electrically isolated from the voltage control circuit 235 by the transistor Q4 that is in the OFF state.

The voltage VERAH is applied to the gate and one terminal of the transistor Q1. The transistor Q1 outputs a voltage VERAa to the node ND2.

The diode D1 outputs the potential VERAa of the node ND2 to the resistor R1. An output voltage VERAb of the diode D1 lowers from the VERAa by an amount corresponding to the threshold voltage Vf of the diode D1.

The output voltage VERAb of the diode D1 is divided according to a resistance ratio between the resistors R1 and R2, and is applied to the node ND3.

The comparison circuit 66 compares the large/small relationship between the reference voltage Vref and the potential VERAb of the node ND3. The comparison circuit 66 outputs a signal corresponding to the comparison result to the charge pump 170*a*.

The charge pump 170*a* varies, or keeps, the magnitude of the voltage value of the VERAH that is output, in accordance with the signal from the comparison circuit 66. In this manner, by the feedback process, the voltage control circuit 235 can cause the output voltage VERAH of the charge pump 170*a* to gradually approach a value near a desired voltage value.

Based on the comparison result of the comparison circuit 66 or the passage of a certain period, the transistors Q2 and Q3 are set in the ON state by the signal S1. Thereby; the output voltage of the transistor Q2 is applied to the gate of the transistor Q4 via the transfer circuit 65. The transistor Q4 is set in the ON state.

The potential of the node ND2 is applied to one terminal (one of source/drains) of the transistor Q4.

The transistor Q4 that is in the ON state transfers a voltage VERAc to the interconnect BLBIAS. As a result, the voltage control circuit 235 can supply the voltage VERAc having a desired voltage value to the diode circuit 231.

In this manner, in the present embodiment, the voltage that is compared with the reference voltage VREF is generated by using the diode D1. Thereby, the voltage that is applied to the diode DD is set such that the voltage drop due to the threshold voltage of the diode DD of the diode circuit 231 can be compensated.

For example, one voltage control circuit 235 is provided in association with one memory cell array 18. It should be noted, however, that one voltage control circuit 235 may be provided in association with one block BLK. In this case, a plurality of mutually independent voltage control circuits 235 and a plurality of mutually independent interconnects BLBIAS are provided.

Note that the voltage control circuit 235 may be regarded as a constituent element in the voltage generation circuit 17.

The voltage control circuit 235 may be designed in consideration of a voltage drop due to the threshold voltage of the transistor (e.g. transistor Q4), in addition to the voltage drop due to the threshold voltage of the diode.

The diode circuit 231 includes a plurality of diodes DD in the semiconductor substrate 9.

In the diode circuit 231, an n-type well region 61*n* is provided in the p-type semiconductor substrate (e.g. p-type silicon substrate). A p-type well region 62*p* is provided in the n-type well region 61*n*. A plurality of n-type diffusion layers 60*n* are provided in the well region 62*p*. A pn junction is formed by the diffusion layer 60*n* and the well region 62*p*.

The diode DD is formed by the pn junction. Each diode DD is connected to a corresponding bit line BL via a contact plug (e.g. the contact plug CPS in FIG. 5)

When the memory cell array 18 is formed in a p-type well region in an n-type well region in a p-type semiconductor substrate, the diode circuit 231 (diodes DD) may be provided in a well region in the memory cell array 18.

One p-type diffusion layer 60*p*1 is provided in the well region 62*p*. The other p-type diffusion layer 60*p*2 is provided in the well region 61*n*. The diffusion layer 60*p*2 and well region 61*n* form a diode (pn junction). The diffusion layer 60*p*1 is connected to the interconnect BLBIAS. The voltage VERAc (voltage VERA+Vf) is applied to the diffusion layers 60*p*.

Thereby, the voltage VERAc is applied to each of the well regions 61*n* and 62*p*.

A p-type diffusion layer 60*x* is provided in the semiconductor substrate 9. The p-type diffusion layer 60*x* is connected to a ground terminal. A ground voltage VSS is applied to the semiconductor substrate 9. Thereby, at the time of the erase operation, the pn junction between the p-type semiconductor substrate 9 and the n-type well region 61*n* is set in a reverse bias state. Note that, at the time of the erase operation, the pn junction between the p-type diffusion layer 60*p*1 and n-type well region 61*n* is set in a forward bias state.

The diode DD lowers the voltage VERAC, which is applied to the anode (p-type well region 62*p*) of the diode DD, by an amount corresponding to the threshold voltage Vf of the diode DD, and transfers the lowered voltage to the bit line BL. As described above, the voltage VERAc has a voltage value corresponding to the sum of the erase voltage VERA and the threshold voltage Vf of the diode. Therefore, the output voltage of the diode DD is substantially equal to the value of the voltage VERA which can erase the data of the memory cell MC.

For example, one diode circuit 231 is provided in association with one memory cell array 18. It should be noted, however, that one diode circuit 231 may be provided in association with one block BLK. In this case, a plurality of mutually independent diode circuits 231 and a plurality of mutually independent interconnects BLBIAS are provided.

Note that the diode circuit 231 may be regarded as a constituent element in the sense amplifier 20.

Figure 9:
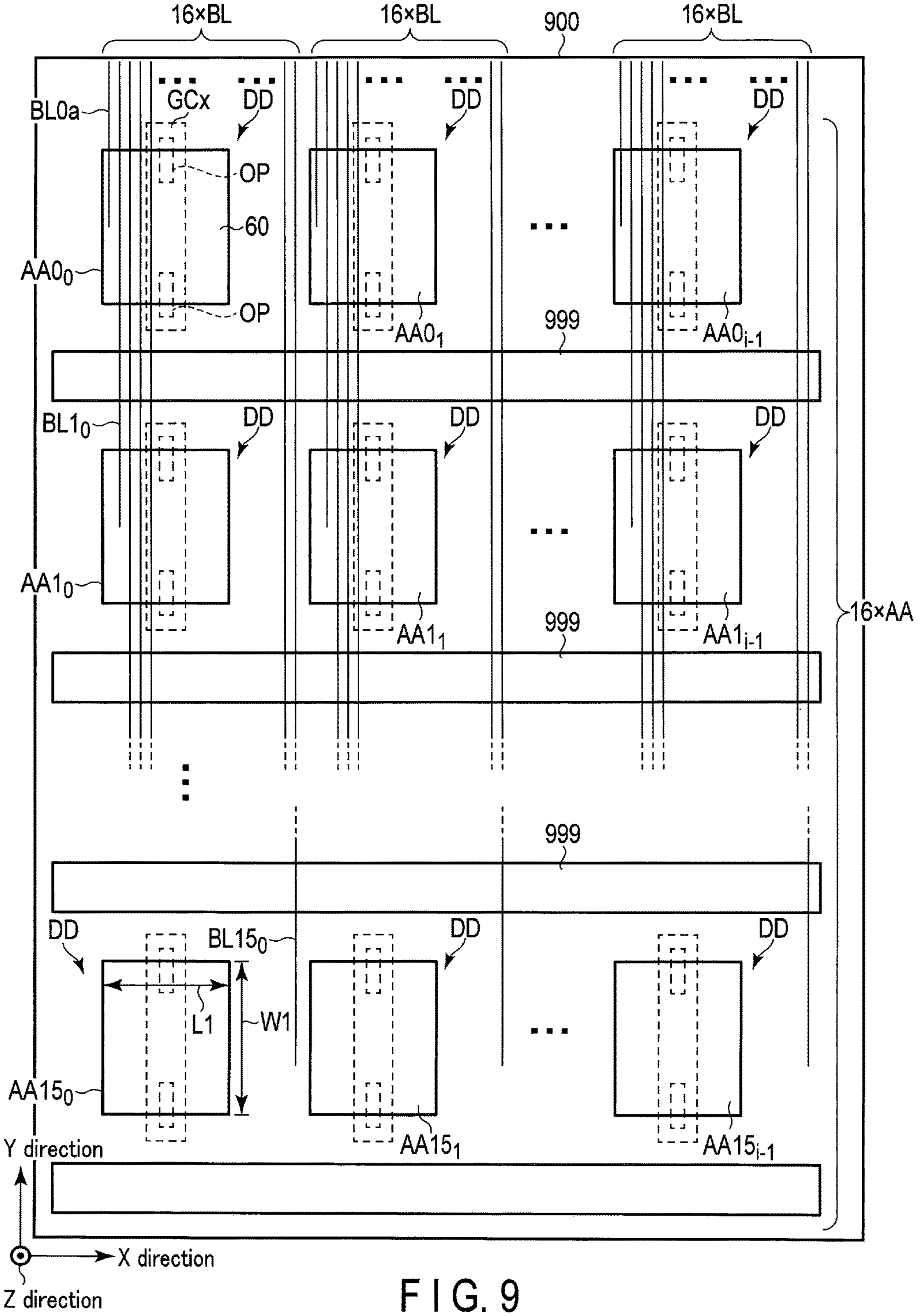

FIG. 9 is a top view illustrating an example of the layout of diodes of the erase circuit in the NAND flash memory of the present embodiment. In FIG. 9, the bit lines BL are illustrated in a simplified manner.

As illustrated in FIG. 9, a plurality of semiconductor regions AA ($AA\mathbf{0}_0$, $AA\mathbf{1}_0$, . . . , $AA\mathbf{15}_0$, . . . , $AA\mathbf{15}_{i-1}$) are arranged in a matrix in the semiconductor substrate 9. Symbol i is a natural number of 1 or more.

For example, the diffusion layers 60*n* and well regions 61 and 62 are provided in the semiconductor region AA. A region between the semiconductor areas AA, which neighbor in the X direction, may be a device isolation region (insulation layer) or may be a semiconductor region (e.g. a p-well region). The diodes DD are arranged in a matrix. In the description below, the region in which the diodes DD are provided is referred to as "diode array 900".

A dummy pattern 999 is provided between the semiconductor regions AA which neighbor in the Y direction. The dummy pattern 999 extends in the X direction. For example, the material of the dummy pattern 999 is the same as the material of the conductive layer GC.

Bit lines BL ($BL\mathbf{0}_0$, $BL\mathbf{1}_0$, . . . , $BL\mathbf{15}_0$, . . . ) are arranged in the X direction. Each bit line BL extends in the Y direction above the semiconductor region AA (and device isolation region).

When 16 bit lines BL are allocated to a plurality of semiconductor regions AA which are arranged in the Y direction, 16 semiconductor regions AA are arranged in the Y direction in the diode array.

One diode DD is provided in one semiconductor region AA. The respective bit lines BL are extended in the Y direction to vicinities where the corresponding diodes DD are disposed, such that one bit line BL is connected to one diode DD. The bit line BL is connected to the corresponding diode DD via a contact plug (not shown) and an interconnect (not shown).

Note that a gate pattern (a multilayer body including a conductive layer and a gate insulation film) GCx may be provided on the semiconductor region AA. The gate pattern (also called "gate stack") GCx may be used as a contact region for the bit line BL. The conductive layer of the gate pattern GCx is directly connected to the semiconductor region AA via an opening portion OP provided in the gate insulation film.

The area of the semiconductor region AA, where one diode DD is provided, is smaller than the area of the semiconductor region where the high breakdown voltage transistor is provided. For example, a dimension L1 in the X direction of the semiconductor region AA is set to be about half the dimension in the gate length direction of the semiconductor region where the low breakdown voltage transistor (e.g. the clamp transistor TR2 of the sense amplifier circuit) is provided. For example, a dimension W1 in the Y direction of the semiconductor region AA may be properly set, based on a minimum area of the semiconductor region and/or a density of arrangement of a plurality of gate patterns/dummy patterns CGx, 999 in the X-Y plane.

As described above, the NAND flash memory of the present embodiment can reduce the area of the circuit which applies the erase voltage VERA to the bit line BL.

(b) Operation

Referring to FIG. 10 to FIG. 12, an operation example of the NAND flash memory of the present embodiment will be described.

(b-1) Erase Operation

Referring to FIG. 10, an erase operation of the NAND flash memory of the present embodiment will be described.

<Time Instant t0*a*>

At time instant t0*a*, the host device 600 requests the memory controller 5 to execute erase of data in the flash memory 1.

Based on the request for data erasing, the memory controller 5 generates an erase command. The memory controller 5 sends the erase command, an address and a control signal to the flash memory 1.

The flash memory 1 receives the erase command, address and control signal.

In the flash memory 1, the sequencer 15 controls the operations of the respective circuits in the flash memory 1, based on the command and control signal, thereby to execute the erase operation. The row decoder 19 decodes the row address RA. The column decoder 22 decodes the column address CA.

Based on the decoded result of the row address RA, the row decoder 19 selects (activates) a row (block and/or word line) in the memory cell array 18.

The erase circuit 23 selects (activates) a column in the memory cell array 18. For example, the decoded result of the column address by the column decoder 22 may be supplied to the erase circuit 23. Note that the discharge circuit 67 may discharge the interconnect BLBIAS before the generation/supply of the erase voltage VERA.

In the voltage generation circuit 17, the charge pump 170*a* operates. The charge pump 170*a* generates the voltage VERAH. The generated voltage VERAH is supplied from the charge pump 170*a* to the erase circuit 23.

In the erase circuit 23, the voltage control circuit 235 controls the magnitude of the voltage that is to be supplied to the interconnect BLBIAS, by the feedback process on the supplied voltage VERAH. During the period of control of the voltage VERAH, the transistors Q2 and Q3 are set in the OFF state by the signal S1. Accordingly, the transistor Q4 is set in the OFF state. Therefore, the diode circuit 231 is electrically isolated from the voltage control circuit 235.

<Time Instant t1*a*>

At time instant t1*a*, the sequencer 15 (or sensor amplifier 20) sets the potential of the interconnect BLS at a voltage V1 (e.g. power supply voltage VDD). The transistor TR1 is set in the ON state.

The sequencer 15 sets the clamp transistor TR2 in the ON state by the control of the signal level of the signal BLC. For example, the sense amplifier circuit SAU outputs a voltage VDDSA (e.g. about 2.0 V to 2.5 V).

At the time of the erase operation, a voltage VWLE (e.g. 0 V to 0.5 V) is applied to at least one word line (hereinafter referred to as "selected word line") WL in a selected block (or selected region). For example, a voltage VERA is applied to at least one word line (hereinafter referred to as "unselected word line") WL-u in an unselected block (or unselected region). A voltage VE (e.g. 12 V to 17 V) is applied to the select gate lines SGD and SGS.

The sequencer 15 (or erase circuit 23) sets the transistors Q2 and Q3 in the ON state by the control of the signal level of the signal S1. The transistor Q2 transfers the voltage VERAc to the gate of the transistor Q4 via the transfer circuit 65. Thereby, the transistor Q4 is set in the ON state.

As a result, the voltage VERAc having a desired voltage value is supplied to the interconnect BLBIAS.

The VERAc is applied to the anode (well region 62*p*) of the diode DD. In the diode DD, a voltage drop occurs in the VERAc (=VERA+Vf) according to the threshold voltage Vf of the diode DD. The diode DD transfers the voltage VERA (e.g. 23 V to 25 V) to the bit line BL.

In this manner, in the present embodiment, the erase voltage VERA having a certain voltage value is supplied from the diode DD to the bit line BL.

In addition, the erase voltage VERA is applied to the source line SL.

By the application of the erase voltage VERA, GIDL occurs in the select transistor ST1 (and select transistor ST2). Hot carriers (e.g. holes) due to GIDL are supplied to the semiconductor layer 51 of the memory pillar MP. The hot carriers in the semiconductor layer 51 are injected in the charge storage layer 522 of the memory cell MC.

Thereby, the threshold voltage of the memory cell MC is shifted to the negative voltage value side. As a result, the state of the memory cell MC is set in the erase state.

<Time Instant t2*a*>

At time instant t2*a*, in the erase circuit 23, after the erase voltage VERA is applied to the bit line BL via the diode DD, the charge pump 170*a* stops the generation of the voltage VERAH. For example, after the application of the erase voltage VERA, the discharge circuit 67 discharges the interconnect BLBIAS.

The potential of the selected word line WL-s, the potential of the unselected word line WL-u, the potential of the source line SL, the potentials of the select gate lines SGD and SGS, and the potential of the interconnect BLS are set to the ground voltage VSS. The signal level of the signal BLC is set at "L" level.

Note that erase verify may be executed for a target region (e.g. block) of the erase operation, after the erase voltage VERA is applied from the diode DD to the bit line BL. When the result of the erase operation is "fail", the erase voltage VERA of a certain voltage value is applied. When the result of the erase verify is "pass", the erase operation is completed.

In the above-described manner, the erase operation of the NAND flash memory of the present embodiment is completed.

(b-2) Read Operation

Referring to FIG. 11, a description will be given of the read operation of the NAND flash memory of the present embodiment. FIG. 11 is a timing chart illustrating an example of the read operation of the flash memory of this embodiment.

<Time Instant t0*b*>

At time instant t0*b*, the host device 600 requests the memory controller 5 to execute data reading. The memory controller 5 generates a read command. The read command, an address and a control signal are sent from the memory controller 5 to the flash memory 1.

The flash memory 1 receives the read command and address. In the flash memory 1, the sequencer 15 controls the operations of the respective circuits in the flash memory 1, based on the read command and control signal.

<Time Instant t1*b*>

At time instant t1*b*, based on the decoded result of the addresses by the row decoder 19 and column decoder 22, the row and column of the memory cell array 18 are activated/inactivated (selection/non-selection).

At the time of the read operation, a plurality of charge pumps 170 of the voltage generation circuit 17 generate a read voltage (determination voltage) VCGRV and an unselect voltage VREAD. At this time, the charge pump 170*a* does not generate the voltage VERAH.

At time instant t1*b*, the sequencer 15 sets the potential of the interconnect BLS at a voltage V2 (e.g. 7 V). Thereby, the transistor TR1 is set in the ON state. The sequencer 15 changes the signal level of the signal BLC from "L" level to "H" level. Thereby, the clamp transistor TR2 is set in the ON state. For example, the sense amplifier circuit SAU outputs a voltage V3 (e.g. V4~V4+0.5 V).

A predetermined voltage is applied to the bit line BL via the ON-state transistors TR1 and TR2. Thereby, the bit line BL is charged.

For example, a voltage V4 (e.g. 0 V~1.2 V) is applied to the source line SL.

Based on the address ADD, a voltage VSG is applied to the select gate lines SGD and SGS. Thereby, the select transistors ST1 and ST2 are set in the ON state.

The read voltage VCGRV of a predetermined voltage value is applied to the selected word line WL-s. The voltage value of the voltage VCGRV varies depending on a select address (page). The unselect voltage VREAD is applied to the unselected word line WL-u.

In accordance with the voltage applied to the selected word line WL-s, the selected cell is set in the ON state, or is kept in the OFF state.

In accordance with the ON/OFF of the selected cell, the bit line BL is discharged, or the bit line BL keeps the charged state. The sense amplifier circuit SAU senses the charged/discharged state of the bit line BL. A signal corresponding to the sensed result is retained in the sense amplifier circuit SAU.

In order to determine data, the read voltage VCGRV is applied once or more, and the charge/discharge of the bit line BL is sensed once or more. Based on one or more sensed results, the data stored in the selected cell is determined. Thereby, the read data is determined.

At the time of the read operation, the charge pump 170*a* does not operate. A voltage of 0 V is applied to the interconnect BLBIAS in the erase circuit 23. The potential of the bit line BL is not less than the potential of the interconnect BLBIAS. Therefore, at the time of the read operation, the diode DD is set in the reverse bias state. Accordingly, at the time of the read operation, the supply of voltage from the erase circuit 23 to the bit line BL is substantially stopped.

Thus, in the present embodiment, at the time of the read operation, there occurs substantially no operational error due to the diode DD that is connected to the bit line BL in the erase circuit 23.

<Time Instant t2*b*>

At time instant t2*b*, the potential of the selected word line WL-s, the potential of the unselected word line WL-u, the potential of the source line SL, the potentials of the select gate lines SGD and SGS, and the potential of the interconnect BLS are set to the ground voltage VSS. The signal level of the signal BLC is set at "L" level.

The flash memory 1 sends the read data to the memory controller 5. The memory controller 5 sends the read data to the host device.

In the above-described manner, the read operation of the flash memory of the present embodiment is completed.

(b-3) Write Operation

Referring to FIG. 12, a description will be given of the write operation of the flash memory of the present embodiment. FIG. 12 is a timing chart illustrating an example of the write operation of the flash memory of this embodiment.

<Time Instant t0*c*>

At the time of the write operation of the flash memory, the host device 600 requests the memory controller 5 to execute data writing. The memory controller 5 generates a write command. The write command, an address, write data and a control signal are sent from the memory controller 5 to the flash memory 1.

The flash memory 1 receives the write command, address, write data and control signal.

<Time Instant t1*c*>

Based on the decoded result of the addresses by the row decoder 19 and column decoder 22, the row and column of the memory cello array 18 are activated/deactivated (selection/non-selection).

At the time of the write operation, in the voltage generation circuit 17, a plurality of charge pumps 170 generate a program voltage VPGM, a verify voltage VVFY, and an unselect voltage VPASS. At this time, the charge pump 170*a* does not generate the voltage VERAH.

At time instant t1*c*, at the time of the write operation, the sequencer 15 sets the potential of the interconnect BLS at a voltage V2. Thereby, the transistor TR1 is set in the ON state. The sequencer 15 controls the signal level of the signal BLC. Thereby, the clamp transistor TR2 is set in the ON state.

In the sense amplifier 20, the sense amplifier circuit SAU controls the potential of the bit line BL according to the data that is to be written to the corresponding memory cell. A predetermined voltage corresponding to the write data is applied to the bit line BL via the ON-state transistors TR1 and TR2. For example, the potential of the bit line BL corresponding to a memory cell (hereinafter referred to as "program cell") to which data is written is set to the ground voltage VSS. The potential of the bit line BL corresponding to a memory cell (hereinafter referred to as "program inhibit cell") to which data is not written is set to a voltage V5 (>VSS). For example, the voltage V5 has a voltage value which is close to the voltage VDDSA.

Based on the address ADD, a voltage VSGD (e.g. VSGD>VSG) is applied to the select gate line SGD. Thereby, the select transistor ST1 is set in the ON state. A voltage VSS is applied to the select gate line SGS. The select transistor ST2 is set in the OFF state.

<Time Instant t2*c*>

At time instant t2*c*, an unselect voltage VPASS is applied to a selected word line WL-s and an unselected word line WL-u.

Thereafter, the potential of the selected word line WL-s is raised from the unselect voltage VPASS to the program voltage VPGM of a certain voltage value. Thereby, the program voltage VPGM is applied to the gate of the selected cell. In accordance with the voltage value of the program voltage VPGM and the potential of the bit line BL, the threshold voltage of the program cell shifts to the high potential side. The threshold of the program inhibit cell is maintained.

<Time Instant t3*c*>

At time instant t3*c*, the potential of the selected word line WL-s, the potential of the unselected word line WL-u, the potential of the source line SL, the potentials of the select gate lines SGD and SGS, and the potential of the interconnect BLS are set to the ground voltage VSS. The signal level of the signal BLC is set at "L" level.

<Time Instant t4*c*>

After the application of the program voltage VPGM, a verify operation (program verify) is executed.

At time instant t4*c*, a verify voltage VVFY including a voltage value of 1 level or more is applied to the selected word line WL-s. An unselect voltage VREAD is applied to the unselected word line WL-u. In addition, a voltage VSG is applied to the select gate lines SGD and SGS.

Like the above-described sense operation in the read operation, the potential state (charge/discharge) of the bit line BL relating to the verify voltage VVFY is sensed.

Based on the sensed result, it is determined whether the verify result of the selected cell is "pass" or "fail".

<Time Instant t5*c*>

At time instant t5*c*, the potential of the selected word line WL-s, the potential of the unselected word line WL-u, the potential of the source line SL, the potentials of the select gate lines SGD and SGS, and the potential of the interconnectnect BLS are set to the ground voltage VSS. The signal level of the signal BLC is set at "L" level.

Thereafter, based on the verify result, the application of the program voltage VPGM and the application of the verify voltage VVFY are executed repeatedly.

At the time of the write operation, the charge pump 170*a* does not operated. A voltage (ground voltage VSS) of 0 V is applied to the interconnect BLBIAS in the erase circuit 23. The potential of the bit line BL is not less than the potential of the interconnect BLBIAS. At the time of the write operation, the diode DD is set in the reverse bias state. Accordingly, at the time of the write operation, the supply of voltage from the erase circuit 23 to the bit line BL is substantially stopped.

In this manner, in the present embodiment, at the time of the write operation, there occurs substantially no operational error due to the diode DD that is connected to the bit line BL in the erase circuit 23.

When a certain number or more of selected cells are "pass" in the verify operation, the potential of the selected word line WL-s, the potential of the unselected word line WL-u, the potential of the source line SL, the potentials of the select gate lines SGD and SGS, and the potential of the interconnect BLS are set to the ground voltage VSS. The signal level of the signal BLC is set at "L" level.

In the above-described manner, the write operation in the flash memory of the present embodiment is completed.

(c) Conclusion

The semiconductor memory (e.g. NAND flash memory) of the present embodiment executes the erase operation by applying the erase voltage to the bit line.

In the semiconductor memory of the present embodiment, the erase circuit (or sense amplifier) includes a plurality of diodes. One diode is connected to one corresponding bit line. The erase voltage is applied from the diode to the bit line.

The area of one diode is smaller than the area of one field-effect transistor (high breakdown voltage transistor).

Therefore, the semiconductor memory of the present embodiment can reduce the area of circuitry, compared to the configuration in which the erase voltage is transferred to the bit line by using the field-effect transistor (high breakdown voltage transistor). Accordingly, the semiconductor memory of this embodiment can reduce the chip size.

In addition, when the chip size of the semiconductor memory is not changed, the semiconductor memory of the present embodiment can increase a design margin degree (e.g. a distance between interconnects, a dimension of a device region/device isolation region) of circuitry on the semiconductor substrate, by reducing the area of circuitry. As a result, the semiconductor memory of the present embodiment can improve a manufacturing yield of semiconductor memories.

As described above, the semiconductor memory of the present embodiment can decrease the manufacturing cost.

(2) Second Embodiment

Referring to FIG. 13 to FIG. 18, a semiconductor memory of a second embodiment will be described.

(a) Configuration

Figure 13:
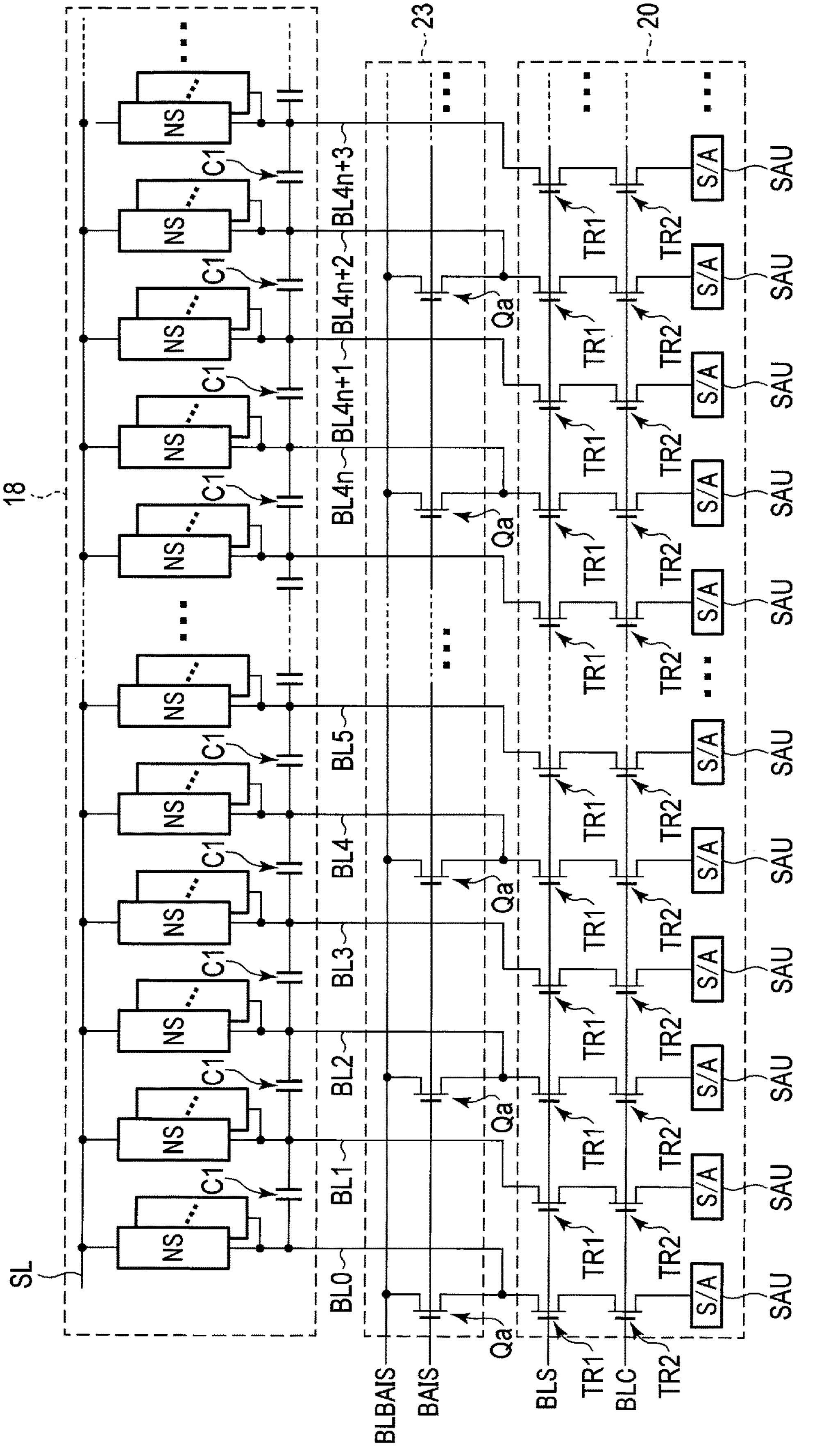
FIG. 13 is a view illustrating a configuration example of a semiconductor memory of a second embodiment.

Referring to FIG. 13, a configuration example of the semiconductor memory of the present embodiment will be described.

FIG. 13 is a view illustrating a configuration example of the erase circuit of the semiconductor memory (NAND flash memory) of the present embodiment.

As illustrated in FIG. 13, in the flash memory of the present embodiment, in the erase circuit 23, field-effect transistors Qa are used in place of the diodes. A signal BIAS is supplied to the gates of the transistors Qa. The ON/OFF of the transistors Qa is controlled according to the signal level of the signal BIAS.

The erase voltage VERA is applied to the bit line BL via the field-effect transistor Qa. The field-effect transistor Qa is a high breakdown voltage transistor.

In the present embodiment, a plurality of bit lines BL include bit lines to which the field-effect transistors Qa are connected, and bit lines to which the field-effect transistors Qa are not connected.

In the example of FIG. 13, of two mutually neighboring bit lines, one bit line (e.g. an odd-numbered bit line) BL0, BL2, . . . , BL4*n*, BL4*n*+2, . . . , is connected to the field-effect transistor Qa. Of the two mutually neighboring bit lines, the other bit line (e.g. an even-numbered bit line) BL1, BL3, . . . , BL4*n*+1, BL4*n*+3, . . . , is not connected to the field-effect transistor Qa.

The number of field-effect transistors Qa, which transfer the erase voltage VERA to the bit lines BL, is about half the number of bit lines BL.

Hereinafter, when the odd-numbered bit lines BL0, BL2, . . . , BL4*n*, BL4*n*+2, . . . , are not distinguished, these bit lines are expressed as "BL-o". When the even-numbered bit lines BL1, BL3, . . . , BL4*n*+1, BL4*n*+3, . . . , are not distinguished, these bit lines are expressed as "BL-e".

At the time of the erase operation, the erase voltage VERA is applied to one bit line BL-o. At the time of the erase operation, the other bit line BL-e is set in the floating state. The potential of the bit line BL-e that is in the floating state is raised up to a level close to the potential of the neighboring bit line BL-o, due to capacitive coupling C1 between bit lines BL. Thereby, the potential of the bit line BL-e is set at a level close to the erase voltage VERA.

FIG. 14 is a view for describing capacitive coupling between bit lines in the flash memory of the present embodiment. FIG. 14 illustrates an example of factors of capacitive coupling between bit lines. FIG. 14 illustrates a capacitance between members, which can be included in capacitive coupling, and a ratio of capacitance between members in the capacitive coupling.

In FIG. 14, a capacitance component, which is small in amount included in the capacitive coupling between bit lines, is indicated by zero, and a major capacitance component, which is included in the capacitive coupling between bit lines, is indicated by a value greater than zero.

As illustrated in FIG. 14, when the flash memory includes a memory cell array (see FIG. 5) of a three-dimensional configuration, the capacitive coupling of the bit lines BL occurs due to the capacitance between mutually neighboring memory pillars (PL-PL), the capacitance between mutually neighboring bit lines (M1-M1), and the capacitance between the memory pillar MP and select gate line SGD (PL-SGD). The parasitic capacitance between pillars is greater than the parasitic capacitance between bit lines.

In this manner, each bit line BL includes a capacitive coupling C1 due to the capacitance (e.g. parasitic capacitance) between members in the memory cell array.

FIG. 15 is a view for describing the setting of potentials of bit lines according to the layout of memory pillars in the memory cell array in the flash memory of the present embodiment. FIG. 15 illustrates 16 memory pillars in an extracted manner. For the purpose of clearer description, numbers (reference signs) "MP0", "MP1", . . . , "MP15" are added to the 16 memory pillars. In FIG. 15, it is indicated that memory pillars MP with hatching are memory pillars to which the erase voltage VERA is applied. In FIG. 15, for the purpose of clearer description, the bit lines BL are indicated by broken lines.

As illustrated in FIG. 15, the memory pillars MP are arranged in a layout of a staggering fashion on the X-Y plane. The bit lines BL extend in the Y direction. Two bit lines BL pass over one memory pillar MP.

When the capacitance between memory pillars is greater than the capacitance between bit lines, it is preferable that the bit lines, to which the erase voltage VERA is applied, are set such that the memory pillars MP, to which the erase voltage VERA is applied, are arranged in the Y direction.

As regards the bit lines and memory pillars which are set in the floating state in FIG. 15, there are two patterns relating to a two-dimensional layout. In the example of FIG. 15, there are a pattern corresponding to the bit line BL7, and a pattern corresponding to the bit line BL9.

In the pattern of the bit line BL7, the capacitance between memory pillars MP is added to the bit line BL7 with respect to four directions. As regards the bit line BL7, the capacitance between bit lines BL of one of the two neighboring bit lines BL6 and BL8 is added to the bit line BL7.

In the pattern of the bit line BL9, the capacitance between memory pillars is added to the bit line BL9 with respect to three directions. As regards the bit line BL9, the capacitances between bit lines BL of both of the two neighboring bit lines BL8 and BL10 are added to the bit line BL9.

The bit lines BL are connected to the memory pillars MP such that the magnitude of capacitive coupling is averaged between the memory pillars on the outside of the string unit SU (the terminal end side of the string unit, the near side to the slit) and the memory pillars on the inside. Thus, an average value of the capacitive coupling of the bit line BL7 and the capacitive coupling of the bit line BL9 becomes the value of capacitive coupling of one arbitrary bit line BL in the string unit. For example, the average value of the capacitive coupling of bit lines BL is about 1.35 pF. Here, it is assumed that the magnitude of current by GIDL (hereinafter, referred to as "GIDL current") is 200 pA per bit line. It is assumed that the erase period (the period of application of erase voltage) is 1 ms.

In this case, an example of the value of the voltage drop (ΔV) in the voltage, which is applied to the bit line in the floating state, is expressed as below. Note that ΔV is expressed as ΔQ/C. Here, ΔQ is a value obtained from "GIDL current×erase period".

$$\Delta V=200\times10^{-12}\times(1\times10^{-3}/1.35\times10^{-12})=0.148\ [V]$$

In this manner, even if there occurs the voltage drop ΔV (=0.148 V) for the value of the erase voltage, the potential in the bit line BL in the floating state becomes a sufficient value for data erasing.

An operation example of the NAND flash memory of the present embodiment is substantially the same as the operation example of the NAND flash memory of the first embodiment. Therefore, descriptions of the erase operation, read operation and write operation of the flash memory of the present embodiment are omitted.

However, the operation example of the flash memory of the present embodiment is different from the example of the first embodiment in that the transistor Qa is set in the ON state or OFF state by the signal BIAS in accordance with the operation which the flash memory is to execute.

At the time of the erase operation, the transistor Qa of the erase circuit 23 is set in the ON state by the signal BIAS that is at "H" level. Thereby, the transistor Qa transfers the erase voltage VERA to the bit line BL.

At the time of the read operation and at the time of the write operation, the transistor Qa is set in the OFF state by the signal BIAS that is at "L" level. Thereby, at the time of the read operation and at the time of the write operation, the erase voltage VERA is not applied to the bit line BL. At the time of the read operation and at the time of the write operation, the sense amplifier circuit SAU applies a certain voltage to each bit line BL.

Figure 16:
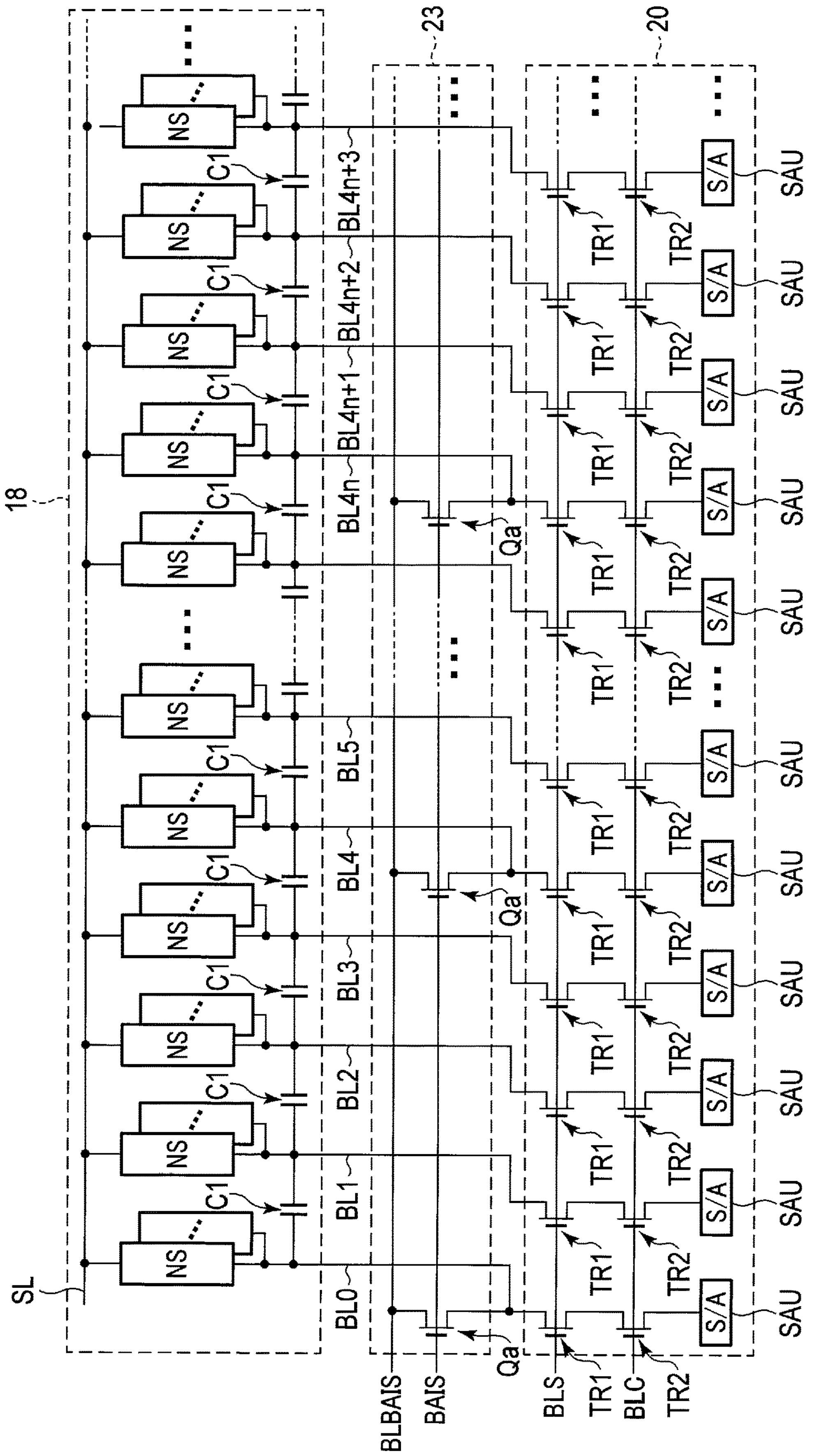

FIG. 16 and FIG. 17 illustrate a modification of the erase circuit of FIG. 13 in the flash memory of the present embodiment.

As illustrated in FIG. 16, the field-effect transistor Qa may be connected to every fourth bit line BL.

In the erase circuit 23 of FIG. 16, field-effect transistors Qa are connected to bit lines BL0, BL4, . . . , BL4*n*.

At the time of the erase operation, bit lines BL1, BL2, BL3, . . . , BL4*n*+1, BL4*n*+2, BL4*n*+3, to which field-effect transistors are not connected, are set in the floating state.

Three bit lines BL4*n*+1, BL4*n*+2 and BL4*n*+3 in the floating state are disposed between two bit lines BL4*n* and BL4*n*+4 to which the erase voltage VERA is applied.

The potentials of the bit lines BL4*n*+1, BL4*n*+2 and BL4*n*+3 in the floating state are raised up to a level close to the erase voltage VERA by the capacitive coupling of bit lines BL.

FIG. 17 is a view for describing the setting of potentials of bit lines according to the layout of memory pillars in the memory cell array in the flash memory of the present embodiment.

Like the example of FIGS. 14 and 15, as regards the bit lines (memory pillars) which are set in the floating state, there are two patterns relating to a two-dimensional layout.

For example, in the pattern of the bit line BL7, the capacitance between memory pillars is added to the bit line BL7 with respect to three directions. As regards the bit line BL7, the capacitance between bit lines of one of the two neighboring bit lines BL6 and BL8 is added to the bit line BL7.

For example, in the pattern of the bit line BL9, the inter-pillar capacitance is added to the bit line BL9 with respect to one direction. As regards the bit line BL9, both of the two neighboring bit lines BL8 and BL10 are set in the floating state.

In the example of FIG. 16 and FIG. 17, the value of capacitive coupling of the bit line BL is, e.g. about 0.75 pF, on the basis of an average value between the capacitive coupling of the bit line BL7 and the capacitive coupling of the bit line BL9.

Like the example of FIG. 14 and FIG. 15, the voltage drop (ΔV) occurring in the bit line that is in the floating state is expressed as follows.

$$\Delta V=200\times10^{-12}\times(1\times10^{-3}/0.75\times10^{-12})=0.267\ [V]$$

Also in the flash memory of the example of FIG. 16 and FIG. 17, even if the voltage drop ΔV occurs, a voltage of a sufficient voltage value can be applied as erase voltage to the bit line BL in the floating state.

In the above-described manner, the erase operation of the flash memory of the present embodiment is executed.

(b) Conclusion

In the present embodiment, the NAND flash memory includes the bit lines connected to the interconnect BLBIAS via the transistors Qa, and the bit lines BL that are not connected to the interconnect BLBIAS. In the flash memory of this embodiment, the erase voltage VERA is applied to the bit line BL that is not connected to the interconnect BLBIAS, by the capacitive coupling between bit lines.

FIG. 18 is a view for explaining the advantageous effects of the flash memory of the present embodiment.

As illustrated in FIG. 18, in the flash memory of the present embodiment, as the number of transistors (high breakdown voltage transistors), which transfer erase voltage to the bit lines, becomes smaller, the size of the area where the transistors are disposed becomes smaller.

In the flash memory of this embodiment, the voltage (erase voltage) for use in the erase operation is supplied to the bit line that is not connected to the erase circuit, by using the capacitive coupling between mutually neighboring bit lines (between NAND strings) (the parasitic capacitance between mutually neighboring pillars and/or the parasitic capacitance between mutually neighboring bit lines).

In this manner, the flash memory of the present embodiment can reduce the area of the region where high breakdown voltage transistors are disposed, while setting the potential of erase voltage, which is applied to the bit lines at the time of the erase operation, at a predetermined value.

For example, according to the present embodiment, the area of the region in the erase circuit, where high breakdown voltage transistors are disposed, is reduced to a range of from ⅛ to ⅞.

As described above, in the NAND flash memory of the present embodiment, the number of high breakdown voltage transistors, which are relatively large in size, can be reduced. As a result, the NAND flash memory of this embodiment can reduce the chip size.

Alternatively, in this embodiment, when the chip size is maintained, the degree of freedom of design of circuitry provided on the chip (semiconductor substrate) can be improved.

Therefore, the semiconductor memory of the second embodiment can reduce the manufacturing cost of the semiconductor memory.

(3) Modifications

Figure 20:
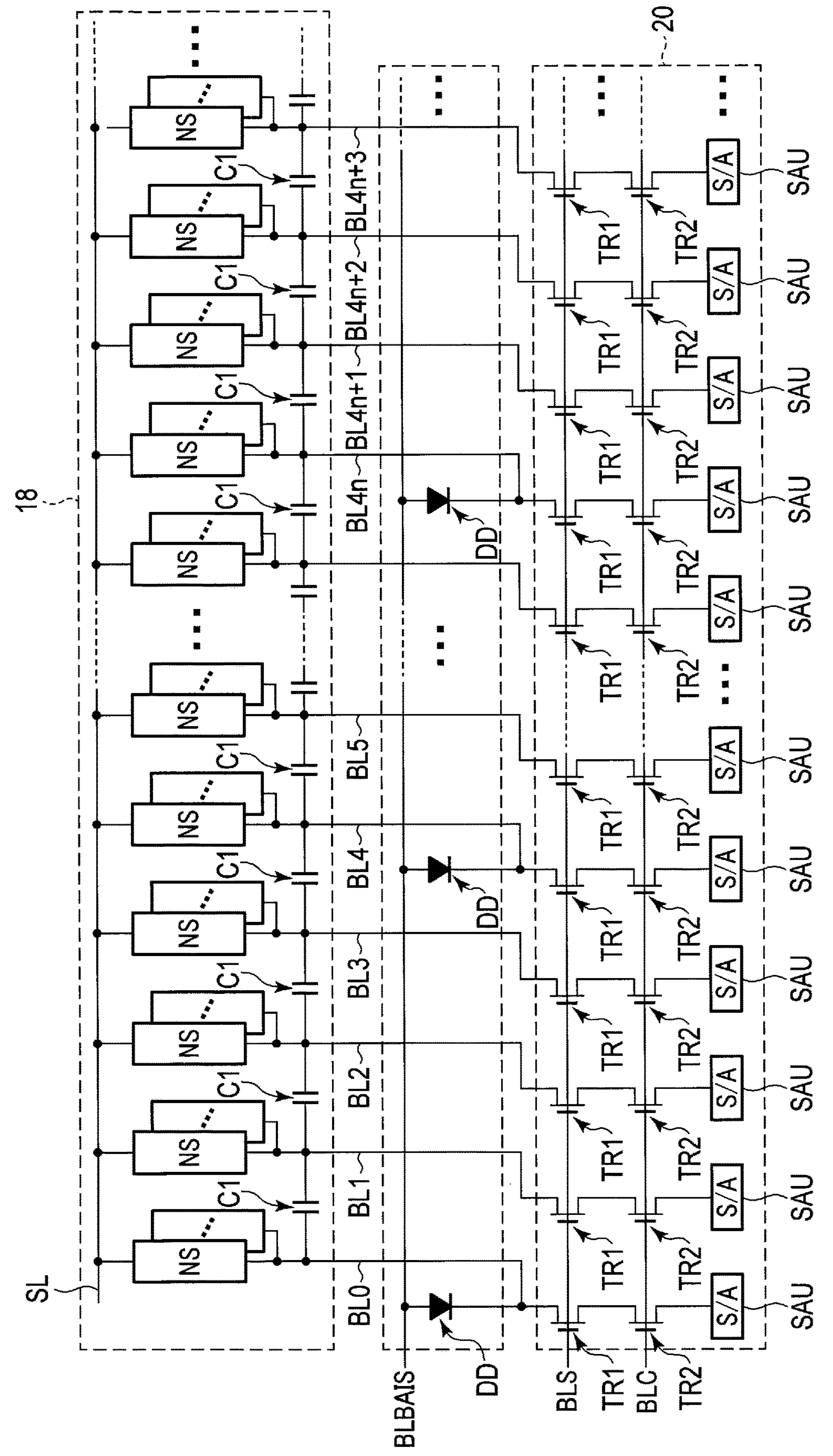

Referring to FIG. 19 and FIG. 20, modifications of the semiconductor memory of the embodiments will be described.

FIG. 19 is a schematic view illustrating an example of modifications of the semiconductor memory (e.g. NAND flash memory) of the embodiment.

As illustrated in FIG. 19, the erase circuit 23 includes a plurality of diodes DD.

In the present modification, the diodes DD are connected to odd-numbered bit lines BL-o. Even-numbered bit lines BL-e are not connected to the diodes DD.

The erase voltage VERA is applied from the diodes DD to the odd-numbered bit lines BL-o. The erase voltage VERA is not applied from the erase circuit 23 to the even-numbered bit lines BL-e.

At the time of the erase operation, the even-numbered bit lines BL-e are set in the floating state.

In the example of FIG. 19, like the second embodiment, the potential of the even-numbered bit line BL-e is raised up to a level close to the potential of the erase voltage VERA applied to the odd-numbered bit line BL-o, by the capacitive coupling due to the capacitance between pillars and/or the capacitance between bit lines.

In this manner, at the time of the erase operation, the flash memory 1 of the present modification can apply the erase voltage VERA to the bit line (bit line not connected to the interconnect BLBIAS) BL-e that is not connected to the diode DD of the erase circuit 23, by using the capacitive coupling of bit lines BL.

For example, the number of diodes DD in the erase circuit 23 in the example of FIG. 19 is half the number of bit lines BL.

Therefore, the NAND flash memory of the present modification can further reduce the area of circuitry.

FIG. 20 is a schematic view illustrating an example of modifications of the semiconductor memory of the embodiment.

As illustrated in FIG. 20, in the erase circuit 23, the diodes DD may be connected to 4n-th bit lines BL0, BL4, . . . , BL**4*n*, and may not be connected to (4n+1)th, (4n+2)th and (4n+3)th bit lines BL1, BL2, BL3, . . . , BL4*n*+1, BL4*n*+2, BL4*n***+3.

In the example of FIG. 20, at the time of the erase operation, the erase voltage VERA is transferred to the 4n-th bit lines BL0, BL4, . . . , BL**4*n*** from the interconnect BLBIAS via the diode DD.

Like the example of FIG. 16, at the time of the erase operation, the (4n+1)th, (4n+2)th and (4n+3)th bit lines BL1, BL2, BL3, . . . , BL**4*n*+1, BL4*n*+2, BL4*n*+3 are set in the floating state. The potentials of the bit lines BL1, BL2, BL3, . . . , BL4*n*+1, BL4*n*+2, BL4*n***+3 are raised to a level close to the erase voltage VERA by the capacitive coupling of bit lines BL.

The flash memory of the example of FIG. 20 can further reduce the area of circuitry.

As has been described above, like the first and second embodiments, the modifications of the embodiments can reduce the manufacturing cost of the semiconductor memory.

(4) Others

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory comprising:

a first bit line;

a first select transistor having a first terminal connected to the first bit line;

a first memory cell connected to a second terminal of the first select transistor;

a circuit connected to the first bit line and applying an erase voltage to be applied to the first memory cell to the first bit line via the first terminal and the second terminal; and a diode connected to the first bit line and the first circuit.

2. The semiconductor memory according to claim 1, wherein a bias direction of the diode is a forward bias direction at a time of an erase operation of the first memory cell, and a reverse bias direction at a time of a write operation of the first memory cell and at a time of a read operation of the first memory cell.

3. The semiconductor memory according to claim 1, further comprising:

a first sense amplifier connected to the first bit line; and a first transistor connected to the first sense amplifier and a node to which the first bit line and the diode is connected.

4. The semiconductor memory according to claim 1, further comprising:

a semiconductor substrate including the diode; and a memory cell array provided above the semiconductor substrate and including the first memory cell.

5. The semiconductor memory according to claim 4, wherein the diode includes:

a first semiconductor region of a first conductivity type provided in the semiconductor substrate of a second conductivity type;

a second semiconductor of the second conductivity type provided in the first semiconductor region; and a third semiconductor region of the first conductivity type provided in the second semiconductor region.

6. The semiconductor memory according to claim 1, further comprising:

a second bit line neighboring the first bit line and being not connected to the first circuit;

a second select transistor having a third terminal connected to the second bit line; and a second memory cell connected to a fourth terminal of the second select transistor.

7. A semiconductor memory comprising:

a first bit line;

a first memory string connected to the first bit line and including a first memory pillar;

a second bit line neighboring the first bit line;

a second memory string connected to the second bit line and including a second memory pillar;

a source line connected to the first memory string and the second memory string;

a circuit applying a first erase voltage to the first bit line and a second erase voltage to the source line; and a first element connected to the first bit line and the circuit.

8. The semiconductor memory according to claim 7, wherein the second bit line is not connected to the circuit.

9. The semiconductor memory according to claim 7, further comprising:

a third bit line neighboring the second bit line;

a third memory string connected to the third bit line and including a third memory pillar; and a second element connected to the third bit line and the circuit.

10. The semiconductor memory according to claim 7, further comprising:

a third bit line neighboring the second bit line;

a third memory string connected to the third bit line and including a third memory pillar;

a fourth bit line neighboring the third bit line;

a fourth memory string connected to the fourth bit line and including a fourth memory pillar;

a fifth bit line neighboring the fourth bit line;

a fifth memory string connected to the fifth bit line and including a fifth memory pillar; and a second element connected to the fifth bit line and the circuit, wherein the second bit line, the third bit line and the fourth bit line are not connected to the circuit.

11. The semiconductor memory according to claim 7, wherein the first element is a diode.

12. The semiconductor memory according to claim 7, wherein the first element is a transistor.

13. A semiconductor memory comprising:

a first bit line;

a select transistor having a first terminal connected to the first bit line;

a first memory cell connected to a second terminal of the select transistor;

a source line connected to the first memory cell;

a circuit applying a voltage to the first memory cell; and a first element connected to the first bit line and the circuit, wherein at a time of an erase operation of the first memory cell, the circuit applies a first voltage to a gate terminal of the select transistor, a second voltage higher than the first voltage to the source line, and a third voltage higher than the second voltage to the first element.

14. The semiconductor memory according to claim 13, wherein the first element is a diode having an anode connected to the circuit and a cathode connected to the first bit line.

15. The semiconductor memory according to claim 13, wherein the third voltage is higher than the second voltage by a voltage drop in the diode.

16. The semiconductor memory according to claim 13, further comprising:

a second bit line neighboring the first bit line and being not connected to the first circuit; and a second memory cell connected to the second bit line.

* * * * *